US006470469B1

(12) United States Patent
Chou et al.

(10) Patent No.: US 6,470,469 B1
(45) Date of Patent: Oct. 22, 2002

(54) RECONSTRUCTION OF MISSING COEFFICIENTS OF OVERCOMPLETE LINEAR TRANSFORMS USING PROJECTIONS ONTO CONVEX SETS

(75) Inventors: Philip A. Chou, Bellevue; Sanjeev Mehrotra; Albert S. Wang, both of Kirkland, all of WA (US)

(73) Assignee: Microsoft Corp., Redmond, WA (US)

( * ) Notice: Subject to any disclaimer, the term of this patent is extended or adjusted under 35 U.S.C. 154(b) by 0 days.

(21) Appl. No.: 09/276,842

(22) Filed: Mar. 26, 1999

(51) Int. Cl.$^7$ .......................... H03M 13/00; H04L 1/00; G06T 5/00
(52) U.S. Cl. ....................................... 714/746; 714/776
(58) Field of Search ................................. 714/746, 776

(56) References Cited

U.S. PATENT DOCUMENTS 6,012,159 A  *  1/2000  Fischer et al. ............... 714/755

OTHER PUBLICATIONS

Hein et al., "Reconstruction of Oversampled Band–Limited Signals From Sigma–Delta Encoded Binary Sequences", IEEE Transactions on Signal Processing, vol. 42, No. 4, Apr. 1994, pp. 799–811.*

Hemami, "Reconstruction–Optimized Lapped Orthogonal Transforms for Robust Image Transmission", IEEE Transactions on Systems for Video Technology, vol. 6, No. 2, Apr. 1996, pp. 168–181.*

Goyal, V.K., et al., "Multiple Description Transform Coding of Images", *Proceedings of the IEEE International Conference on Image Processing*, Chicago, Illinios, 674–678 (Oct. 1998).

Goyal, V.K., et al., "Multiple Description Transform Coding: Robustness to Erasures Using Tight Frame Expansions", *Proceedings of the IEEE International Symposium on Information Theory*, Cambridge, MA, 408, (Aug. 1998).

Goyal, V.K., et al., "Quantized Overcomplete Expansion in $IR^N$: Analysis, Synthesis, and Algorithms", *IEEE TRans. Information Theory*44(1), 16–31, (Jan. 1998).

Jiang, W., et al., "Multiple Description Coding Via Polyphase Transform and Selective Quantization", *SPIE Conference on Visual Communications and Image Processing*, 11 p. (Jan. 1999).

Miguel, A.C., et al., "SPIHT for Generalized Multiple Description Coding", Submitted to *IEEE International Conference on Image Processing*, Kobe, Japan, 11 p. (1999).

Youla, D.C., "Mathematical Theory of Image Restoration by the Method of Convex Projections", In: *Image Recovery: Theory and Applications*, Stark, H., (ed.), Academic Press, p. 29–77 (1987).

* cited by examiner

Primary Examiner—Stephen M. Baker
(74) Attorney, Agent, or Firm—Lyon & Harr, LLP; Katrina A. Lyon

(57) ABSTRACT

A projection onto convex sets (POCS)-based method for consistent reconstruction of a signal from a subset of quantized coefficients received from an N×K overcomplete transform. By choosing a frame operator F to be the concatenization of two or more K×K invertible transforms, the POCS projections are calculated in $R^K$ space using only the K×K transforms and their inverses, rather than the larger $R^N$ space using pseudo inverse transforms. Practical reconstructions are enabled based on, for example, wavelet, subband, or lapped transforms of an entire image. In one embodiment, unequal error protection for multiple description source coding is provided. In particular, given a bit-plane representation of the coefficients in an overcomplete representation of the source, one embodiment of the present invention provides coding the most significant bits with the highest redundancy and the least significant bits with the lowest redundancy. In one embodiment, this is accomplished by varying the quantization stepsize for the different coefficients. Then, the available received quantized coefficients are decoded using a method based on alternating projections onto convex sets.

33 Claims, 17 Drawing Sheets

RECONSTRUCTION OF MISSING COEFFICIENTS OF OVERCOMPLETE LINEAR TRANSFORMS USING PROJECTIONS ONTO CONVEX SETS

REFERENCE TO RELATED APPLICATION

This application is related to co-pending application having Ser. No. 09/276,955 entitled APPARATUS AND METHOD FOR UNEQUAL ERROR PROTECTION IN MULTIPLE-DESCRIPTION CODING USING OVER-COMPLETE EXPANSIONS and assigned to the same assignee as the present application and filed on the same day herewith and incorporated by reference.

FIELD OF THE INVENTION

This invention relates generally to the field of computer data recovery transformations, and in particular to recovery of signal data such as image data, wherein portions of the data have been lost.

COPYRIGHT NOTICE/PERMISSION

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawing hereto: Copyright© 1998–1999, Microsoft Corporation. All Rights Reserved.

BACKGROUND

Channels used to transmit data are sometimes "noisy" and can corrupt or lose portions of the data transmitted. A channel is said to "corrupt" portions of the data if it changes some data values during transmission without notice to the receiver. A channel is said to "lose" or "erase" portions of the data if it does not transmit some data values to the receiver, but notifies the receiver as to which data items were not transmitted. Accordingly, channels may be classified as "corruption" or "erasure" channels. An example of a corruption channel is a wireless communications system wherein data are occasionally corrupted due to electromagnetic noise in the atmosphere. Another example of a corruption channel is a storage system such as a magnetic disk, a Compact Disk Read-Only Memory ("CDROM"), or a Digital Versatile Disk ("DVD"), wherein data are occasionally corrupted due to scratches and dust on the recording media or due to writing or reading errors in the channels which move data onto or off from the media. An example of an erasure channel is a packet communications network wherein certain packets are lost in transmission, and wherein the receiver can detect which data are lost using packet sequence numbers and/or other means. Another example of an erasure channel is a storage system wherein the data are striped across a number of disks, any of which can fail at random, and whose failure can be detected, such that which data items are missing is known. Any corruption channel can appear, at a high level, to be an erasure channel, by appropriate low-level error detection processing. For example, a parity check or checksum word can be transmitted along with a block of data; if the received checksum does not agree with the received data, then an error is detected in the block of data, and the block of data can be considered erased by the channel. It is desirable to have ways to recover the data that is corrupted or lost. For example, image data that have either pixels or blocks that have been lost would have blank (perhaps white or black on a display monitor) or would appear to have "noise" or snow in the received images. A "pixel" is an individual picture element, and is generally represented by a single value indicating, for example, the intensity of image at a point, or the intensity of each of three colors. A "block" is a group of adjacent pixels, generally a rectangle. For example, a block could be a 16-by-16-pixel portion of a larger image.

A "channel" can be a transmission channel, such as digital television broadcast or cable television transmission, or a telephony packet network that moves data over a distance or space. A "channel" can also be a storage channel that stores the data on a storage medium and then reads the data at a later time.

Error-correction codes have been devised for both corruption and erasure channels, and are well known. (See S. Lin and D. J. Costello, *Error Control Coding: Fundamentals and Applications*, Prentice-Hall, 1983, herein Lin and Costello.) By far, the most common error-correction codes are based on linear transformations of the data to add redundancy. If x is a data vector with K elements, and F is an N×K matrix, with $N \geq K$, then y=Fx is a vector with N elements. N−K of these elements can be considered redundant information. By transmitting the code vector y instead of x, the receiver can recover x even if some elements of y are corrupted or lost. In particular, if y is transmitted through an erasure channel, and no more than N−K elements of y are erased, then x can be recovered perfectly. For example, if x is a vector containing 3 binary elements, and $$F = \begin{bmatrix} 1 & 0 & 0 \\ 0 & 1 & 0 \\ 0 & 0 & 1 \\ 1 & 1 & 1 \end{bmatrix},$$

then y is a vector containing 4 binary elements, the first three of which are equal to x (this is called the "systematic" part of y) and the last of which is equal to the sum of the bits in x, modulo 2. That is, the last bit of y is equal to the exclusive-OR, or parity, of x. If any three bits of y are recovered, then x can be recovered perfectly. On the other hand, if two or more bits of y are erased, then x cannot be recovered perfectly; the bits of x that are lost are unrecoverable in this case.

Error-correction codes are intended to recover symbolic data. In the example above, the elements of x are binary symbols. In general, they can be members of a finite field, e.g., they can be M-ary symbols. There is no notion of distance between members of a finite field, except the so-called discrete topology: two elements may be equal or not equal. There is no notion of approximation. Hence in error-correction coding, there is no notion of approximate recovery. An element of x is either recoverable, or it is not.

One type of data for which approximation is useful is signal data, such as image, video, or audio data. Signal data, in contrast to symbol data, has elements that are members of an infinite field, such as the rational numbers, the real numbers, or the complex numbers. In a digital computer, these elements must be represented by finite precision numbers, such as 16-bit signed integers or 32-bit floating-point numbers. However there is a natural notion of distance between two such elements, e.g., the absolute value of their difference. As a consequence, any data vector x containing signal data (such as an image or a frame of audio) can be approximated by another data vector x̂, where the degree of approximation can be measured by the Euclidean distance, a perceptual metric, or some other measure.

It is possible to apply error-correction codes to the transmission of signal data over erasure channels, by treating each signal element as a discrete M-ary symbol. However, this is inefficient. Signals need not be transmitted exactly, provided the approximation error between the signal and its reconstruction is small, on average. Applying a high-redundancy error-correction code can ensure this, but such a solution is expensive in terms of transmission capacity. An alternative is to use "unequal error protection," which is a technique in which only the most important parts of the signal are protected with high redundancy. The less important parts are protected with low redundancy or not at all. One way to implement unequal error protection is the following. If the signal vector x contains elements that are 16-bit integers, then x can be stratified into 16 "bit-planes". Then each bit-plane can be protected using a binary error-correction code with a redundancy commensurate with the importance of the bit-plane in approximating the signal vector x. (See for example J. Hagenauer, "Rate-Compatible Punctured Convolutional Codes (RCPC Codes) and their Applications," IEEE Trans. on Communications, April 1988; A. Albanese, J. Blömer, J. Edmonds, M. Luby, and M. Sudan, "Priority Encoding Transmission," IEEE Trans. Information Theory, November 1996; G. Davis and J. Danskin, "Joint Source and Channel Coding for Image Transmission Over Lossy Packet Networks," SPIE Conf. on Wavelet Applic. of Digital Image Processing, August 1996.)

Even with the technique of unequal error protection, error-correction codes may not be ideally suited to protection of signal data. Ideally, all of the received bits should be used to improve the approximation of the reconstruction. However, in error-correction codes for erasure channels, if more than a critical number of symbols are received, then the additional symbols are ignored, while if fewer than the critical number of symbols are received, then any symbols not in the systematic portion of the code are ignored. In other words, if an error-correction code can correct a symbol exactly then it does not try any harder, while if it cannot correct a symbol exactly then it gives up. Although this may be ideal behavior for symbolic data, it is not ideal behavior for signal data. For signal data, the error control mechanism should try to approximate the transmitted signal with whatever information it has at its disposal.

Signal data is often voluminous. For example, a 512-by-512-pixel image has 262,144 pixel values. Therefore it is important that signal-processing techniques be computationally efficient.

Thus, there is a need for a method and apparatus that can efficiently reconstruct, to a suitable quality of approximation, an image or other set of signal data that has been transmitted on an erasure channel, or for some other reason has missing values.

SUMMARY OF THE INVENTION

The present invention provides a POCS- (Projections Onto Convex Sets)- based algorithm for consistent reconstruction from multiple descriptions of overcomplete expansions. In particular, image data can benefit from the reconstructions provided by the present invention, even when too little data is available for a perfect recreation of the original image. Similarly, audio information is another type of data that can benefit. The algorithm operates in the data space $R^K$ rather than in the expanded space $R^N$, N>K. By constructing the frame from two (or more) complete transform bases, all projections can be expressed in terms of forward or inverse transforms. Since such transforms are usually efficient to compute, the present invention can perform the reconstruction much faster than with previous methods. Indeed, the method of one embodiment provides overcomplete frame expansions of an entire image and reconstruction of the image after transmission through a channel that loses some of the coefficients.

One aspect of the present invention provides a POCS-based algorithm for consistent reconstruction of a signal $x \in R^K$ from any subset of quantized coefficients $y \in R^N$ in an N×K overcomplete frame expansion y=Fx, N=2K. By choosing the frame operator F to be the concatenation of two K×K invertible transforms, the projections may be computed in $R^K$ using only the transforms and their inverses, rather than in the larger space $R^N$ using the pseudo-inverse as proposed in earlier work. This enables practical reconstructions from overcomplete frame expansions based on wavelet, subband, or lapped transforms (one or more of which are used in some of the various embodiments of the present invention) of an entire image, which has heretofore not been possible.

In some embodiments, a set of data x is provided. The set of data x is overcompletely transformed to a set of coefficients y having N dimensions, where N>K. The resulting coefficients of y are quantized to obtain a set of indices j such that each coefficient $y_i$ lies in the $j_i^{th}$ quantization region and each one of the indices j correspond to a respective quantization region. For example, the range of the coefficients of y might be −578.4 to +931.5. This range is divided into 1024 quantization regions, each assigned an index j, where each j is a number between 0 and 1023 inclusive. In some embodiments, the quantization regions are not all the same size. Subsets of the indices j are then entropy coded to obtain binary descriptions (e.g., combined into packets). The binary descriptions are then transmitted on a channel.

In some embodiments, the channel includes a storage medium, and the set of data y are stored onto a storage medium and read from the storage medium.

Another aspect of the present invention provides an apparatus and a corresponding computerized method of reconstructing a set of data x having K dimensions. The method includes receiving a set of data y', wherein the set of data y' corresponds to a set of data y but with some coefficients missing, wherein the set of data y has N dimensions and represents an overcomplete transformation of the set of data x, and wherein N>K and the set of data y' has ≦N dimensions. The method also includes iteratively transforming the received set of data y' using projections onto convex sets as calculated with a computer to produce a set of data x' representing the reconstructed set of data x.

In one embodiment, the method further includes providing an initial set of data x having K dimensions, overcompletely transforming the set of data x to a set of data y having N dimensions, where N>K; and transmitting the set of data y on a channel.

In another embodiment of the method, the transmitting on the channel further includes storing the set of data y onto a storage medium; and reading the set of data y from the medium.

DETAILED DESCRIPTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

The detailed description is divided into multiple sections. A first section describes the hardware and operating environment in the form of a computer system 80 that implements the current invention. This is followed by a description of examples of the initial transformation functions to be used, along with a mechanism for such transformations. Then a section is provided on the recovery transformations that take the received data from a channel and recover a version of the initial data. One particular embodiment is described in which an error-correction overcomplete expansion (or initial redundancy-adding transformation) is used to generate the redundant information to be transmitted, and an error-correction recovery iterative transformation process is used to restore the received data towards its original state. The factors involved in choosing the initial transformations and the recovery transformations are discussed, followed by a conclusion which describes some potential benefits and describes further alternative embodiments.

Hardware and Operating Environment

The invention is directed to a communications system. In one embodiment, the invention includes a hardware- and software-operating environment in which an encoder/transmitter operates in one computer, a receiver/decoder operates in another computer, and they are connected by a communications link. In some embodiments, the communications link is (or includes) a storage medium, and in some such embodiments the encoding and decoding computers are one and the same.

Figure 1:
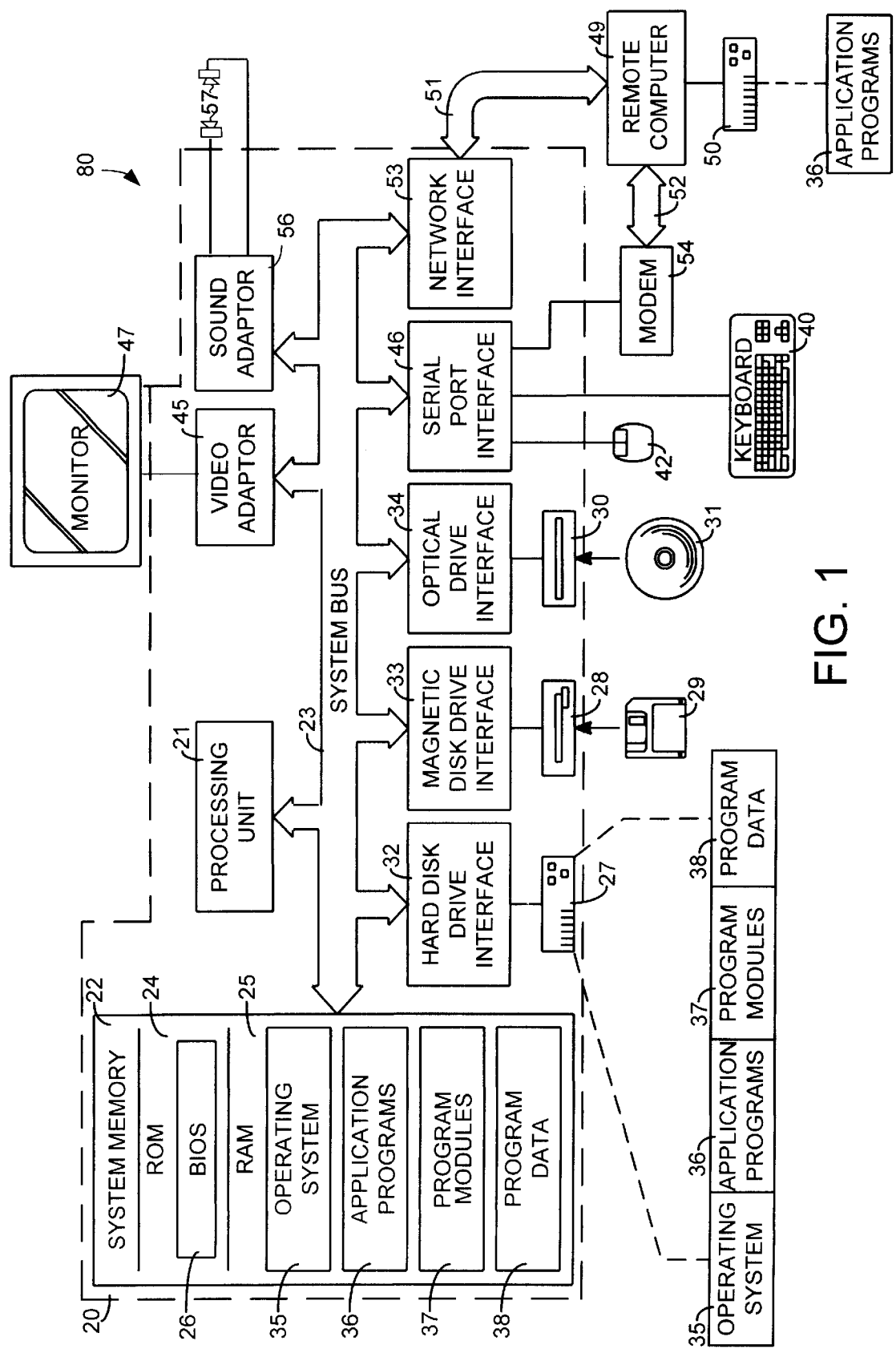
FIG. 1 is a block diagram of a computer system 80 on which the present invention may be implemented.

FIG. 1 provides a brief, general description of a suitable computing environment in which the either the encoder-transmitter or the receiver-decoder, or both, of the invention may be implemented. The invention will hereinafter be described in the general context of computer-executable program modules containing instructions executed by a personal computer (PC). This is one embodiment of-many different computer configurations, some including specialized hardware circuits to enhance performance, that may be used to implement the present invention. Program modules include routines, programs, objects, components, data structures, etc. that perform particular tasks or implement particular abstract data types. Those skilled in the art will appreciate that the invention may be practiced with other computer-system configurations, including hand-held devices, multiprocessor systems, microprocessor-based programmable consumer electronics, network personal computers ("PCs"), minicomputers, mainframe computers, and the like which have multimedia capabilities. The invention may also be practiced in distributed computing environments where tasks are performed by remote processing devices linked through a communications network. In a distributed computing environment, program modules may be located in both local and remote memory storage devices.

FIG. 1 shows a general-purpose computing or information-handling system 80. This embodiment includes a conventional personal computer (PC) 20, that includes processing unit 21, system memory 22, and system bus 23 that couples the system memory and other system components to processing unit 21. In other embodiments other configurations are used in PC 20. System bus 23 may be any of several types, including a memory bus or memory controller, a peripheral bus, and a local bus, and may use any of a variety of bus structures. In the embodiment shown, system memory 22 includes read-only memory (ROM) 24 and random-access memory (RAM) 25. A basic input/output system (BIOS) 26, stored in ROM 24, contains the basic routines that transfer information between components of personal computer 20. BIOS 26 also contains start-up routines for the system. Personal computer 20 further includes hard disk drive 27 having one or more magnetic hard disks onto which data is stored and retrieved for reading from and writing to hard-disk-drive interface 32, magnetic disk drive 28 for reading from and writing to a removable magnetic disk 29, and optical disk drive 30 for reading from and/or writing to a removable optical disk 31 such as a CD-ROM, DVD or other optical medium. Hard disk drive 27, magnetic disk drive 28, and optical disk drive 30 are connected to system bus 23 by a hard-disk drive interface 32, a magnetic-disk drive interface 33, and an optical-drive interface 34, respectively. The drives 27, 28, and 30 and their associated computer-readable media 29, 31 provide nonvolatile storage of computer-readable instructions, data structures, program modules and other data for personal computer 20. Although the exemplary environment described herein employs a non removable hard disk in a hard disk drive 27, a removable magnetic disk 29 and a removable optical disk 31, those skilled in the art will appreciate that other types of computer-readable media which can store data accessible by a computer may also be used in the exemplary operating environment. Such media may include magnetic tape cassettes, flash-memory cards, digital versatile disks (DVD), Bernoulli cartridges, RAMs, ROMs, and the like.

In various embodiments, program modules are stored on the hard disk drive 27, magnetic disk 29, optical disk 31, ROM 24 and/or RAM 25 and may be moved among these devices, e.g., from hard disk drive 27 to RAM 25. Program modules include operating system 35, one or more application programs 36, other program modules 37, and/or program data 38. A user may enter commands and information into personal computer 20 through input devices such as a keyboard 40 and a pointing device 42. Other input devices (not shown) for various embodiments include one or more devices selected from a microphone, joystick, game pad, satellite dish, scanner, and the like. These and other input devices are often connected to the processing unit 21 through a serial-port interface 46 coupled to system bus 23, but in other embodiments they are connected through other interfaces not shown in FIG. 1, such as a parallel port, a game port, or a universal serial bus (USB) interface. A monitor 47 or other display device also connects to system bus 23 via an interface such as a video adapter 48. In some embodiments, one or more speakers 57 or other audio output transducers are driven by sound adapter 56 connected to system bus 23. In some embodiments, in addition to the monitor 47, system 80 includes other peripheral output devices (not shown) such as one or more of scanner, printer, microphone, joystick, game pad, satellite dish, scanner, and the like.

In some embodiments, personal computer 20 operates in a networked environment using logical connections to one or more remote computers such as remote computer 49. Remote computer 49 may be another personal computer, a server, a router, a network PC, a peer device, or other common network node. Remote computer 49 typically includes many or all of the components described above in connection with personal computer 20; however, only a storage device 50 is illustrated in FIG. 1. The logical connections depicted in FIG. 1 include local-area network (LAN) 51 and a wide-area network (WAN) 52, both of which are shown connecting PC 20 to remote computer 49; typical embodiments would only include one or the other. Such networking environments are commonplace in offices, enterprise-wide computer networks, intranets and the Internet.

When placed in a LAN networking environment, PC 20 connects to local network 51 through a network interface or adapter 53. When used in a WAN networking environment such as the Internet, PC 20 typically includes modem 54 or other means for establishing communications over network 52. Modem 54 may be internal or external to PC 20, and connects to system bus 23 via serial-port interface 46 in the embodiment shown. In a networked environment, program modules, such as those comprising Microsoft® Word which are depicted as residing within PC 20 or portions thereof may be stored in remote-storage device 50. Of course, the network connections shown are illustrative, and other means of establishing a communications link between the computers may be substituted.

Software may be designed using many different methods, including object-oriented programming methods. C++ and Java are two examples of common object-oriented computer programming languages that provide functionality associated with object-oriented programming. Object-oriented programming methods provide a means to encapsulate data members (variables) and member functions (methods) that operate on that data into a single entity called a class. Object-oriented programming methods also provide a means to create new classes based on existing classes.

An object is an instance of a class. The data members of an object are attributes that are stored inside the computer memory, and the methods are executable computer code that act upon this data, along with potentially providing other services. The notion of an object is exploited in the present invention in that certain aspects of the invention are implemented as objects in some embodiments.

An interface is a group of related functions that are organized into a named unit. Some identifier may uniquely identify each interface. Interfaces have no instantiation; that is, an interface is a definition only without the executable code needed to implement the methods that are specified by the interface. An object may support an interface by providing executable code for the methods specified by the interface. The executable code supplied by the object must comply with the definitions specified by the interface. The object may also provide additional methods. Those skilled in the art will recognize that interfaces are not limited to use in or by an object-oriented programming environment.

Multiple-description Decoding of Overcomplete Expansions

Introduction

Multiple-description ("MD") source coding is the problem of encoding a single source {Xi} into N separate binary descriptions at rates $R_1, \ldots, R_N$ bits per symbol such that any subset S of the descriptions may be received and together decoded to an expected distortion $D_S$ commensurate with the total bit rate of S.

Figure 2A:
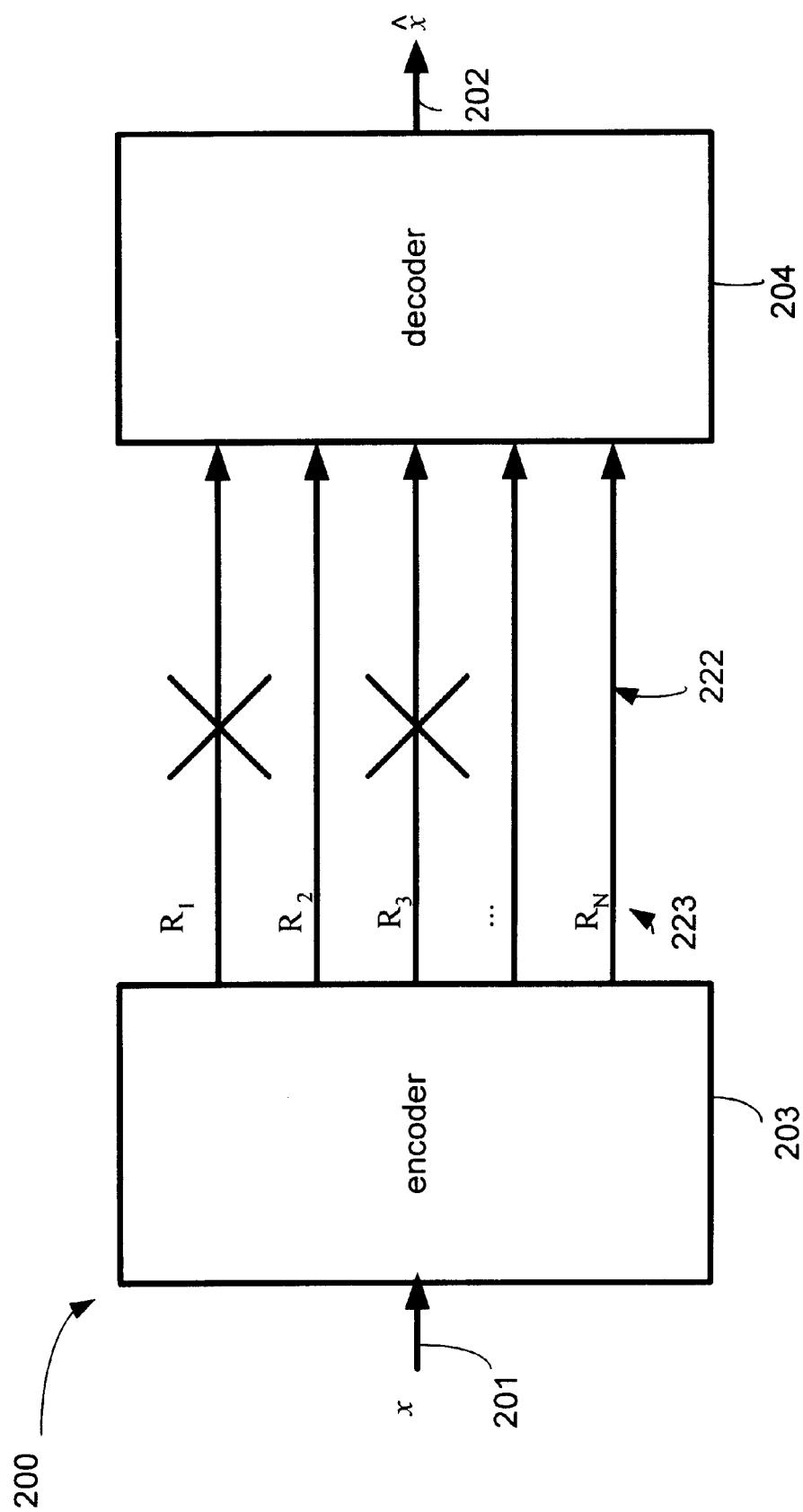
FIG. 2A is a block diagram of a generic multiple-description system.

FIG. 2A shows a generic multiple-description system 200. Signal data x 201 enters the multiple-description encoder 203 on the left. The encoder (or sender) 203 produces N binary descriptions 223 of x at respective rates $R_1, \ldots, R_N$ bits per source symbol (i.e., bits per element of x), and then transmits them over one or more separate channels 222. In some embodiments, binary descriptions 223 are embedded in packets (that include such additional information as routing, checking, destination and source information) for transmission on a packet network 222 (or storage to a storage medium).

Some subset (i.e., zero or more) of the channels 222 is broken, or equivalently, the corresponding descriptions 223 are erased. The remaining descriptions 223' enter the decoder 204. The decoder (or receiver) 204 receives the remaining descriptions over the subset S of working channels 222, and reconstructs the signal x̂ 202 so as to approximate the input signal x with distortion $D_S$ commensurate with the total number of bits received. The signal x̂ 202 is called the "reconstruction" of x 201.

MD coding can be used in a variety of situations where sending signal data over a diversity of channels is helpful in overcoming the potential failure of some subset of channels. Some examples are the following.

Multiple descriptions can be transmitted to a mobile receiver from multiple antennae, so that when some antennae are hidden from the mobile receiver, the receiver is still able to reconstruct the signal with fidelity proportional to the number of visible antennae.

Multiple descriptions can be stored on multiple disks, so that if some of the disks crash or are taken off-line, the signal can still be reconstructed with fidelity proportional to the number of disks on-line.

Multiple descriptions can be transmitted over channels at different frequencies, so that when some channels are jammed or rendered useless by atmospheric fading, the receiver is still able to reconstruct the signal with adequate fidelity.

Multiple descriptions can be transmitted in different packets of a packet network, so that when some packets are lost due to congestion and buffer overflow in the network, the receiver is still able to reconstruct the signal with fidelity commensurate with the number of received packets.

Any erasure channel. All of the examples above, as well as the channel 222 of FIG. 2A, can be considered to be generalized erasure channels, and will herein be referred to simply as "erasure channels".

What distinguishes MD coding, or MD quantization, from standard error-correction coding (for erasure channels) is that the data x 201 to be transmitted is treated as signal data rather than symbol data. That is, approximation is possible in order to reduce the bit rates $R_1, \ldots, R_N$.

MD coding can be seen as a generalization of layered coding (also known as progressive, embedded, or scalable coding), in that in layered coding, the possible subsets of received channels are nested, i.e., contiguous channels 1 through K are received, where K varies between 0 and N. In this case, channel 1 is considered a base layer, and each subsequent layer enhances the previous layer. In contrast, in MD coding, any subset of channels can be received and used to reduce the distortion between x and $\hat{x}$.

Early papers on multiple-description coding are information theoretic and consider the problem of determining for N=2 the set of rates and expected distortions $\{(R_1, R_2, D_1, D_2, D_{1,2})\}$ that are asymptotically achievable, (see, e.g., 1. J. K. Wolf, A. D. Wyner, and J. Ziv. Source coding for multiple descriptions. *Bell System Technical Journal*, 59(8):1417–1426, October 1980; herein "Wolf, et al.";
2. T. M. Cover and A. El Gamal. Achievable rates for multiple descriptions. *IEEE Trans. Information Theory*, 28(6):851–857, November 1982; herein "Cover et al.";
3. L. H. Ozarow. On the source coding problem with two channels and three receivers. *Bell System Technical Journal*, 59(8):1909–1922, October 1980; herein "Ozarow";
4. R. Ahlswede. The rate-distortion region of a binary source for multiple descriptions without excess rate. *IEEE Trans. Information Theory*, 31:721–726, November 1985; herein "Ahlswede";
5. Z. Zhang and T. Berger. Multiple-description source coding with no excess marginal rate. *IEEE Trans. Information Theory*, 41(2):349–357, March 1995; herein "Zhang et al.").

More recent papers consider the problem of designing practical multiple-description quantizers, and their use over erasure channels.

The papers on practical MD quantization have so far taken three main and distinctly different approaches. In the first approach, pioneered by Vaishampayan, MD scalar, vector, or trellis quantizers are designed to produce N=2 descriptions, using a generalized Lloyd-like clustering algorithm that minimizes the Lagrangian of the rates and expected distortions $R_1, R_2, D_1, D_2, D_{1,2}$ (see:

6a. V. A. Vaishampayan. "Vector quantizer design in diversity systems," In *Proc. Conf. On Information Sciences*, $2^{nd}$ September, 1991; herein "Vaishampayan 1";
6b. V. A. Vaishampayan. "Design of multiple-description scalar quantizers," *IEEE Trans. Information Theory*, 39(3):821–834, May 1993; herein "Vaishampayan 2";
7. V. A. Vaishampayan. "Application of multiple-description codes to image and video transmission," In *Proc. 7th Int'l Workshop on Packet Video*, Brisbane, Australia, March 1996; herein "Vaishampayan 3";
8. S. D. Servetto, K. Ramchandran, V. Vaishampayan, and K. Nahrstedt. "Multiple description wavelet based image coding," In *Proc. Int'l Conf. Image Processing*, Chicago, Ill., October 1998. IEEE, herein "Servetto et al.";
9. H. Jafarhkani and V. Tarokh. "Multiple description trellis coded quantization," In *Proc. Int'l Conf. Image Processing*, Chicago, Ill., October 1998. IEEE, herein "Jafarhkani et al.";
10. M. Srinivasan and R. Chellappa. "Multiple description subband coding," In *Proc. Int'l Conf. Image Processing*, Chicago, Ill., October 1998. IEEE; herein "Srinivasan".)

In the second approach, pioneered by Wang, Orchard, and Reibman, MD quantizers are constructed by separately describing (i.e., quantizing and coding) the N coefficients of an N×N block linear transform, which has been designed to introduce a controlled amount of correlation between the transform coefficients (see:

11. Y. Wang, M. T. Orchard, and A. R. Reibman. Multiple description image coding for noisy channels by pairing transform coefficients. In *Proc. Workshop on Multimedia Signal Processing*, pages 419–424. IEEE, Princeton, N.J., June 1997; herein "Wang et al. 1",
12. M. T. Orchard, Y. Wang, V. A. Vaishampayan, and A. R. Reibman. Redundancy rate-distortion analysis of multiple description coding. In *Proc. Int'l Conf. Image Processing*, Santa Barbara, Calif., October 1997. IEEE; herein "Orchard et al.",
13. V. K. Goyal and J. Kovačević. Optimal multiple description transform coding of Gaussian vectors. In *Proc. Data Compression Conference*, pages 388–397, Snowbird, Utah, March 1998. IEEE Computer Society; herein "Goyal et al. 1",
14. V. K. Goyal, J. Kovačević, R. Arean, and M. Vetterli. Multiple description transform coding of images. In *Proc. Int'l Conf. Image Processing*, Chicago, Ill., October 1998. IEEE; herein "Goyal et al. 2",
15. Y. Wang, M. T. Orchard, and A. R. Reibman. Optimal pairwise correlating transforms for multiple description coding. In *Proc. Int'l Conf. Image Processing*, Chicago, Ill., October 1998. IEEE; herein "Wang et al. 2".)

In the third approach, pioneered by Goyal, Kovačević, and Vetterli, M D quantizers are constructed by separately describing the N coefficients of an overcomplete N×K tight frame expansion (see Goyal et al. 2 cited above and 16. V. K. Goyal, J. Kovačević, and M. Vetterli. Multiple description transform coding: robustness to erasures using tight frame expansions. In *Proc. Int'l Symp. Information Theory*, page 408, Cambridge, Mass., August 1998. IEEE; herein "Goyal et al. 3".).

The present invention contributes to this last category. For completeness, it should be mentioned that a number of other papers take yet a fourth approach, in which the natural correlation between symbols is exploited for reconstruction. For example, odd pixels can be predicted from even pixels, and vice versa. This fourth approach is similar to the second approach above, except that the transform is not actively designed. This fourth approach is considered by the inventors to be more closely related to standard error-resilience techniques.

In MD quantization using overcomplete (frame) expansions, a K-dimensional input signal x is represented by an N-dimensional vector y=Fx, where N>K. F 210 is the so-called frame operator, whose N rows span the K-dimensional signal space. This is the same setup as in error-correction coding, except that in MD coding, the elements of x and y (as well the elements of F) are members of an infinite field (such as the rational numbers, the real numbers, or the complex numbers) rather than being members of a finite field. Without loss of generality, the elements of x, y, and F are considered to be real numbers for some embodiments of the present invention.

Herein, the term "overcomplete expansion" and more specifically the term "multiple description overcomplete expansion" are used to designate the signal expansion y=Fx used in MD coding, in contrast to the analogous expansion y=Fx over a finite field used in error-correction coding.

Because the elements of y 217 can have an infinite number of possible values, y must first be quantized and entropy coded into a finite number of bits before being transmitted or stored. One such embodiment is shown in FIG. 2B.

In this embodiment, the N-dimensional vector y 217 is scalar quantized by quantizer 218. In scalar quantization, each element $y_i$ of the N-dimensional vector y is mapped (i.e., using quantizer mapping 288) by a quantizer $Q_i$ to the index $j_i$ of the quantization interval $[l_i, u_i)$ which contains $y_i$. For example, quantizer $Q_i$ may map $y_i$ to 0 if $y_i$ is between −5 and 5, to 1 if $y_i$ is between 5 and 15, to 2 if $y_i$ is between 15 and 25, and so forth, as illustrated in FIG. 2C. The output of quantizer 218 is the set of indices j 221. The inverse quantizer mapping 296 (performned by block 226) provides the received values 227, that include one or more of $l_i, u_i, \hat{y}_i$.

Thus, if $y_i$ is the value 27.109, $j_i$ would be the index 3, and the interval $[l_i, u_i)$ would be [25,35). Often $y_i$ is represented by the midpoint or centroid of the interval, which would be $\hat{y}_i$=30 in this case. If the interval lengths are all constant, then the quantizer is called a uniform scalar quantizer, and the interval length is called the quantizer stepsize. This invention does not require the interval lengths to be constant, either within a quantizer or between quantizers. Thus, in other embodiments, non-uniform interval lengths are used. In particular, in one embodiment (explained further in a section below), the interval length changes between quantizers, to provide unequal redundancy encoding, based on data significance. In principle, it is also possible to perform vector quantization on the N-dimensional vector y. (See A. Gersho and R. M. Gray, Vector Quantization and Signal Compression, Kluwer, 1991, herein Gersho and Gray.) However only scalar quantization is discussed herein.

Figure 2B:
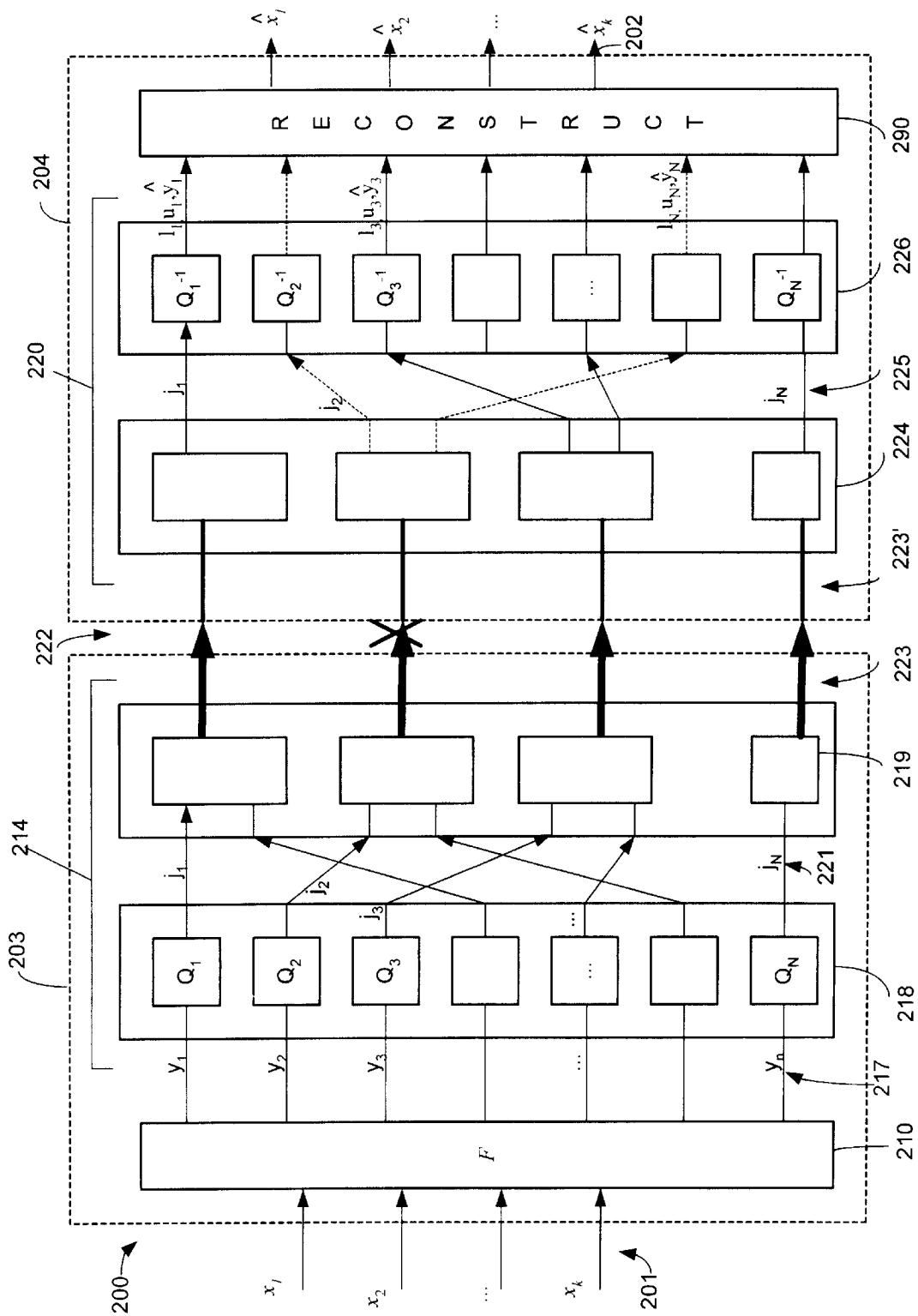
FIG. 2B is a block diagram of a quantizer-entropy encoder and a decoder.
Figure 2C:
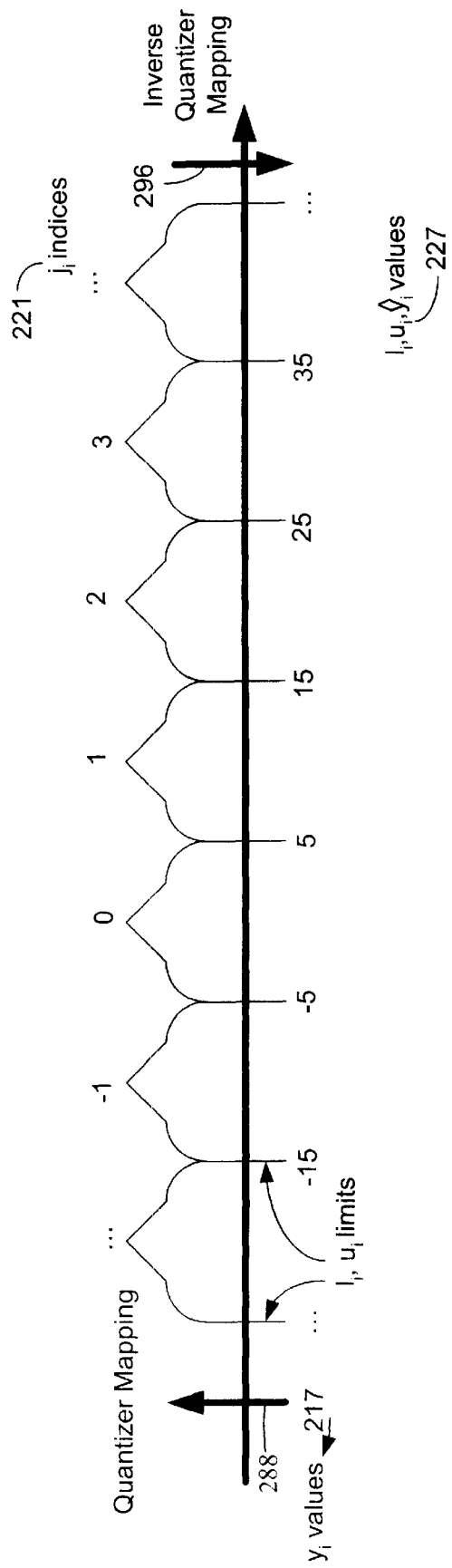
FIG. 2C is a diagram of a quantization method used by the present invention.

In the embodiment shown in FIG. 2B, the indices $j_i$ are grouped, and each group of indices is independently entropy encoded by entropy encoder 219. Entropy encoding is the process of mapping a set of discrete symbols into a binary string whose length is approximately equal to the entropy of the set of symbols. Herein the term "entropy encoding" is used generally to denote the process of creating a binary string, or "binary description" 223 from a group of indices. This can be done with a variety of well-known techniques (see for example Gersho and Gray; A. Said and W. A. Pearlman, "A New, Fast, and Efficient Image Codec Based On Set Partitioning In Hierarchical Trees," IEEE Trans. Circuits and Systems for Video Technology, June 1996; E. Malvar, "Fast Progressive Wavelet Coding," Data Compression Conference, Snowbird, Utah, 1999.). The number of descriptions 223 emanating from the MD encoder is equal to the number of groups. Since groups may contain only a single index $j_i$, it is possible for there to be up to N descriptions 223.

In some embodiments, each of the binary descriptions 223 is embedded into a packet that is transmitted on a packet network or channel 222. Some of the descriptions 223 may be erased in the transmission or storage channel 222. In that, case, only the indices in groups whose descriptions are received 223' can be entropy decoded by entropy decoder 224. Entropy decoding is the inverse of entropy encoding, i.e., the process of mapping a binary string back into a set of discrete symbols. The number of indices that are entropy decoded is only N'≦N after potential erasures. Each decoded index $j_i$ 225 is an indicator of the fact that the corresponding coefficient $y_i$ lies in a particular interval $[l_i, u_i)$. The inverse quantizer $Q_i^{-1}$ 226 therefore maps $j_i$ into the tuple $[l_i, u_i)$, possibly along with the reconstruction level $\hat{y}_i$ (together denoted as received information 227), as illustrated in FIG. 2B. The reconstruction 290 of the vector $\hat{x}$ from the received information $l_i, u_i, \hat{y}_i$ 227 can take a number of forms, described next.

Without loss of generality, assume that descriptions of the first N' coefficients are received, and that descriptions of the last N"=N−N' coefficients are erased. Let y' denote the first N' coefficients, and let y" denote the last N" coefficients, so that $$y = \begin{bmatrix} y' \\ y'' \end{bmatrix} = \begin{bmatrix} F' \\ F'' \end{bmatrix} x = Fx,$$

where F' is N'×K and F" is N"×K. A classical way for the decoder to reconstruct x from the received quantized coefficients $\hat{y}'$ is to use the linear reconstruction $$\hat{x}_{lin} = (F')^+ \hat{y}' \qquad \text{(Equation 1)}$$

where $(F')^+$ is the pseudo-inverse of F'. The pseudo-inverse can be computed from the singular value decomposition F'=U·diag$(\sigma_1, \ldots, \sigma_{N'})V^t$ (see 17 B. Noble and J. W. Daniel. *Applied Linear Algebra*. Prentice-Hall, Englewood Cliffs, N.J., 2nd edition, 1997.) as $(F')=V\cdot\text{diag}(\sigma_1^{-1}, \ldots, \sigma_{N'}^{-1})\cdot U^t$. This is equal to $(F')^+=((F')^t(F')^{-1}(F'))^t$ when F' has full rank, i.e., when at least K descriptions are received (assuming any K rows of F are linearly independent). It can be shown that the reconstruction (Equation 1) has the property that $$\hat{x}_{lin} = \operatorname*{argmin}_{x} \|\hat{y}' - F'x\|^2. \qquad \text{(Equation 2)}$$

That is, when N'≧K, it chooses $\hat{x}_{lin} \in R^K$ to be the coordinates of the point $F'\hat{x}_{lin}$ in the K-dimensional subspace spanned by the columns of F' which is closest to $\hat{y} \in R^{N'}$, i.e., it projects $\hat{y}'$ onto the subspace $F'R^{N'}$. Furthermore, when N'<K, i.e., when the x that minimizes (Equation 2) is not unique, then the reconstruction (Equation 1) chooses an x with minimum norm.

Figure 3A:
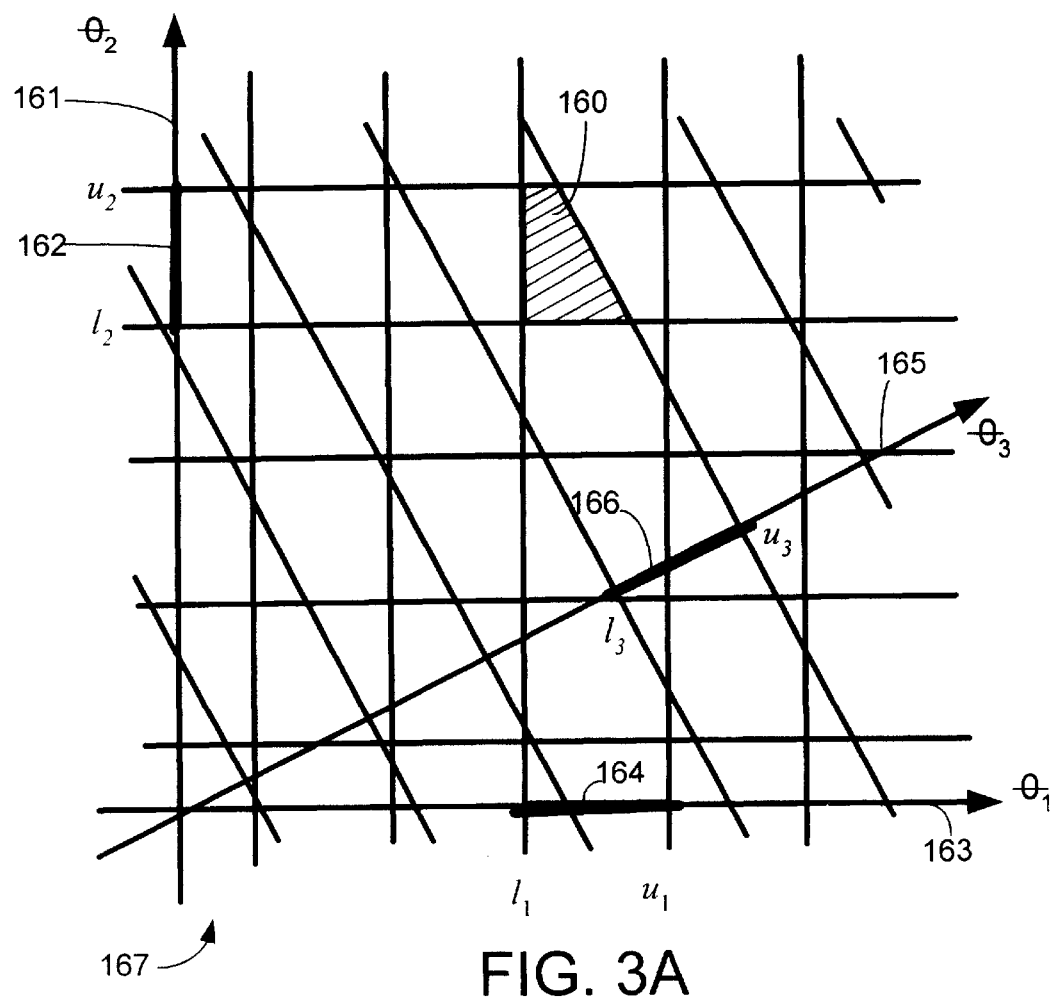
FIG. 3A is a graphical representation of a reconstruction of a two-dimensional value 160 from a quantized three-dimensional description.

The linear reconstruction (Equation 2) is not statistically optimal. The optimal reconstruction $\hat{x}_{opt}$, which minimizes the expected (squared error) distortion $E\|X-\hat{X}_{opt}\|^2$, is the conditional mean of X given the descriptions $y_i \in [l_i, u_i)$ received. That is, $$\hat{x}_{opt} = E[X|Q(FX) = \hat{y}'] = E[X|l' \leq F'X < u'], \quad \text{(Equation 3)}$$

where the relations $l' \leq y'$ and $y' < u'$ are to be taken componentwise. Unfortunately, the conditional expected value of X given that it lies in the region $Q^{-1}(\hat{y}') = \{x: l' \leq F'x < u'\}$ is hard to compute. FIG. 3A shows for K=2 and N'=3 a region $Q^{-1}(\hat{y}')$ 160 for some $\hat{y}'$. Note that the regions $Q^{-1}(\hat{y}')$ for different $\hat{y}'$ are all dissimilar in general.

FIG. 3A is a graphical representation 167 of the set 160 of all possible reconstructions consistent in a quantized three-dimensional description. The three-dimensional description includes descriptions $j_1$ 163 having a quantization interval 164 with a lower limit $l_1$ and upper limit $u_1$, description $j_2$ 161 having a quantization interval 162 with a lower limit $l_2$ and upper limit $u_2$, and description $j_3$ 165 having a quantization interval 166 with a lower limit $l_3$ and upper limit $u_3$. The reconstructed value is somewhere within shaded area 160. Because of the effects of quantization on each of the descriptions, an area at the intersection of the descriptions remains. If only two descriptions were used, the intersection would be a square. When three descriptions are used, the area is reduced to quadrilateral 160.

Figure 3B:
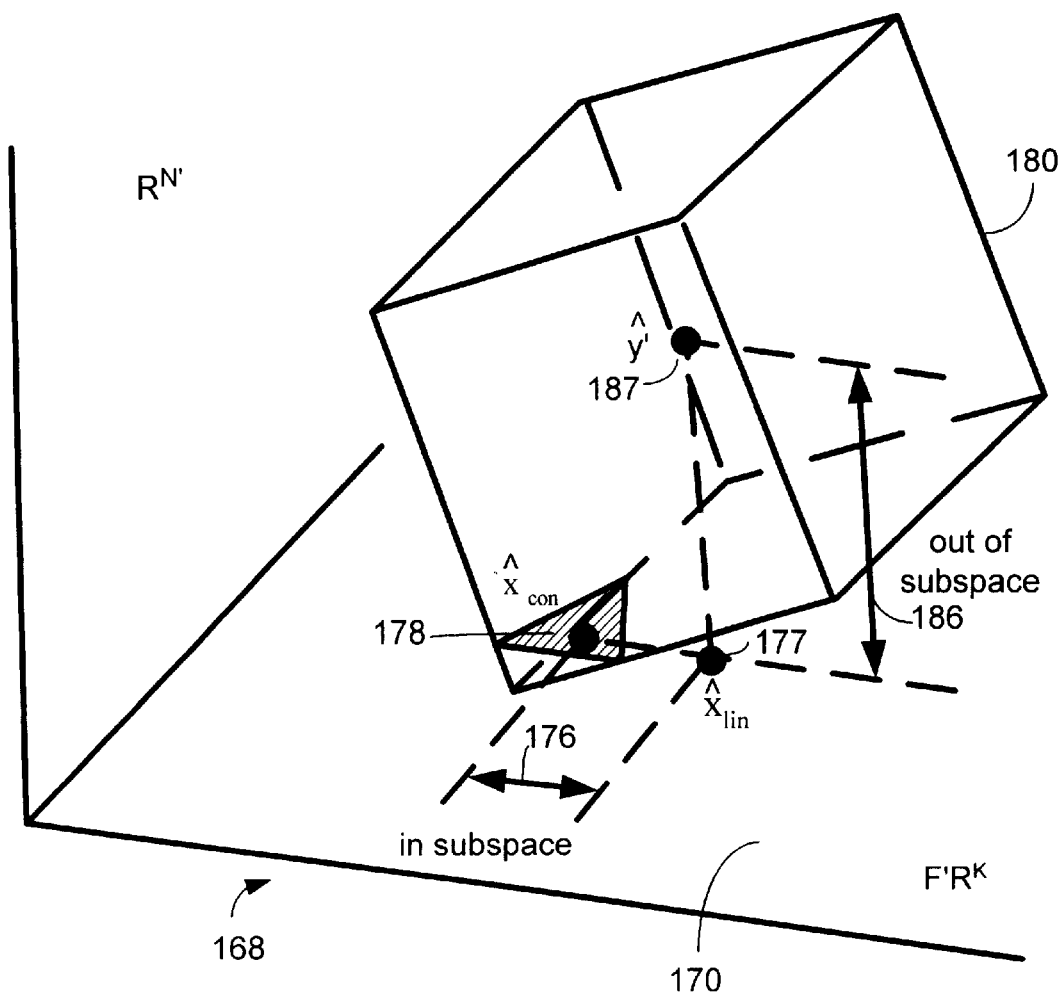
FIG. 3B is a graphical representation of a reconstruction of a two-dimensional value 178 from a quantized three-dimensional description.

Although the optimal reconstruction (Equation 3) is difficult to compute, one thing is certain: x lies in $Q^{-1}(\hat{y}')$, and hence, since $Q^{-1}(\hat{y}')$ is convex, the optimal reconstruction (Equation 3) lies in $Q^{-1}(\hat{y}')$. Any reconstruction $\hat{x}$ which does not lie in $Q^{-1}(\hat{y}')$ is said to be inconsistent (See V. K. Goyal, M. Vetterli, and N. T. Thao. Quantized overcomplete expansions in $R^n$: Analysis, synthesis, and algorithms. *IEEE Trans. Information Theory*, 44(1):16–31, January 1998; herein "Goyal et al. 4"). Goyal et al. 4 describes one conventional POCS reconstruction method. FIG. 3, adapted from Goyal et al., shows again for K=2 and N'=3 an inconsistent reconstruction from the linear projection (Equation 1). It is intuitive that consistent reconstructions have smaller expected squared error distortion than inconsistent reconstructions. In fact, Goyal et al. show that while the expected distortion from linear reconstructions is asymptotically proportional to 1/N, the expected distortion from consistent reconstructions is $O(1/N^2)$ in at least one DFT-based case, and they conjecture this to be true under very general conditions, when the frame is tight.

FIG. 3 is a graphical representation 168 of an inconsistent reconstruction 177 from a quantized three-dimensional description. The centroid $\hat{y}'$ 187 of cube 180 would project to $\hat{x}_{lin}$ 177, which is a distance 176 in the subspace away from a consistent reconstruction $\hat{x}_{con}$ 178 (which may be thought of as in the intersection of cube 180 with plane $F'R^K$ 170). Centroid $\hat{y}'$ 187 is a distance 186 out of the subspace away from $\hat{x}_{lin}$ 177.

An algorithm used by some embodiments of the present invention for producing consistent reconstructions $\hat{x}_{con} \in Q^{-1}(\hat{y}')$ is the POCS (Projections Onto Convex Sets) algorithm (see 19. D. C. Youla. Mathematical theory of image restoration by the method of convex projections. In H. Stark, editor, *Image Recovery: Theory and Applications*. Academic Press, 1987; herein "Youla".).

In the POCS algorithm for M=2 (i.e., where only two functions are used, as more fully described below), an arbitrary initial point $p_t \in R^n$ is alternately projected onto two convex sets $Q \subset R^n$ and $P \subset R^n$, $$q_{t+1} = \operatorname*{argmin}_{q \in Q} \|p_t - q\|^2 \quad \text{(Equation 4)}$$

$$p_{t+1} = \operatorname*{argmin}_{p \in P} \|q_{t+1} - p\|^2 \quad \text{(Equation 5)}$$

until $p_t$ and $q_t$ converge to the intersection of P and Q, or if the intersection is empty, until $p_t$ and $q_t$ respectively converge to the sets $\{p \in P: \|p-q\|^2 \leq \|p'-q\|^2, \forall p' \in P, \forall q \in Q\}$ and $\{q \in Q: \|q-p\|^2 \leq \|q'-p\|^2, \forall q' \in Q, \forall p \in P\}$. The POCS algorithm described above can be extended in the obvious way to more than two sets. For example, a point in the intersection of three convex sets P, Q, and R is given by the limit of $$r_{t+1} = \operatorname*{argmin}_{r \in R} \|p_t - r_0\|^2,$$

$$q_{t+1} = \operatorname*{argmin}_{q \in Q} \|r_{t+1} - q\|^2, \quad \text{and}$$

$$p_{t+1} = \operatorname*{argmin}_{p \in P} \|q_{t+1} - p\|^2.$$

For consistent reconstruction of $x \in R^K$ from the quantized frame expansion $\hat{y}' = Q(F'x) \in R^{N'}$, Goyal et al. (Goyal et al. 4) suggest alternately projecting the initial point $\hat{y}'$ onto the two convex sets $Q = F'R^K \subset R^{N'}$ and $P = Q^{-1}(\hat{y}') \subset R^{N'}$, as shown in FIG. 3. The first projection (Equation 4) onto the linear subspace $F'R^K$ can be accomplished, as usual, by the pseudo-inverse (Equation 1). The second projection (Equation 5) onto the quantization bin $Q^{-1}(\hat{y}')$ can be accomplished by component-wise clipping to the quantization bin. That is, the vector $\hat{y}'$, $l' \leq \hat{y}' \leq u'$, closest to an arbitrary vector $y' \in R^{N'}$ is given component-wise by $$\hat{y}_i' = \text{clip}(y_i', l_i, u_i) = \min\{\max\{y_i', l_i\}, u_i\}. \quad \text{(Equation 6)}$$

Unfortunately, computation of the pseudo-inverse $(F')^+$ requires $O(K^2N')$ operations; the projections themselves require $O(KN')$ operations each.

To reduce the computational complexity of consistent reconstruction, Goyal, Vetterli, and Thao instead suggest finding $\hat{x} \in Q^{-1}(\hat{y}')$ by solving the linear program max $c'\hat{x}$ subject to $$\begin{bmatrix} F' \\ -F' \end{bmatrix} \hat{x} \leq \begin{bmatrix} u \\ -l \end{bmatrix},$$

for an arbitrary objective functional c. They furthermore suggest that by varying c, it may be possible to find all the vertices of $Q^{-1}(\hat{y}')$, whereupon they can be averaged to approximate the region's centroid. (However, they do not appear to follow this latter suggestion.) Although this method avoids the high cost of computing the pseudo-inverse, the complexity of the simplex algorithm for solving the linear program is still O(KN) operations per pivot. This complexity does not present a problem when K and N are small. Goyal, Kovačević, and Vetterli (see Goyal 3 and Goyal 2) apparently apply the algorithm for K=8 and N' up to 10.

We are more interested in decoding multiple descriptions of overcomplete expansions based on overlapping functions, such as provided by wavelet, subband, or lapped transforms. In this case, the N×K frame operator F typically operates on an entire image at a time, for which K=512×512=262,144 is common; N may be twice that. Clearly, in such cases it is not feasible to require O(KN) operations for consistent reconstruction. For wavelet, subband, or lapped transforms, where N=K, F is sparse. In this case, consistent reconstruction can be performed using O(KL) operations, where L is the length of the support of the basis functions. Since L is usually on the order of a few hundred, such reconstruction is eminently feasible, and is used in all modern subband decoders. Both the pseudo-inverse and pivot operations destroy the sparsity of F. The present invention provides an algorithm for consistent reconstruction from multiple descriptions of overcomplete expansions that preserves the efficiency of the sparse representation of F when the basis functions have finite support L. That is, the algorithm has complexity O(KL). The algorithm of the present invention is based on POCS, but the projections are performed in the lower dimensional space $R^K$, rather than in the space $R^N$.

In some embodiments (further explained in a section below), the encoding transform is selected to provide unequal redundancy encoding, based on data significance. In one such embodiment, the starting set of data is a source image having a bit-plane representation, and wherein coefficients of the overcomplete expansion of the source image provide coding the most significant bits with a higher redundancy and the least significant bits with a lower redundancy.

Decoding Algorithm

Let $F_1, \ldots, F_M$ be M invertible K×K transforms. For example, $F_1$ may be a wavelet transform (over an image $x \in R^K$ suitably extended), $F_2$ may be the identity transform, another wavelet transform, or the same wavelet transform over a 1-pixel shift of the image and so forth for $F_3, \ldots, F_M$. Note: in some embodiments as described below in FIG. 7A and FIG. 8A, M=2, and only $F_1$ and $F_2$ are used. However, in general, M can be any integer 2 or larger, as described below in FIG. 7B and FIG. 8B. Let the K-dimensional vectors $y_1=F_1 x, \ldots, y_M=F_M x$ be the M corresponding sets of transform coefficients for $x \in R^K$. Then $$y = \begin{bmatrix} y_1 \\ \vdots \\ y_M \end{bmatrix} = \begin{bmatrix} F_1 \\ \vdots \\ F_M \end{bmatrix} x = Fx \quad \text{(Equation 7)}$$

defines an overcomplete N×K frame expansion of x with redundancy N/K=M. The expansion is tight if $F_1, \ldots, F_M$ are orthonormal. (A frame expansion y=Fx is "tight" if there exists a positive constant M such that for all x, $\|Fx\|^2=M\|x\|^2$. In general, for the multiple description scenario, tightness of the original frame F is of little consequence, because the received frame F' will, in general, not be tight.)

The present invention does not require orthononmality of $F_1, \ldots, F_M$, but it is best if $F_1, \ldots, F_M$ are orthonormally related, i.e., for all i,j, $F_{ij}=F_j F_i^{-1}$ is orthonormal, at least approximately, to ensure convergence of the POCS algorithm.

Let $\hat{y}_1, \ldots, \hat{y}_2$ be the quantized versions of $y_1, \ldots, y_M$, respectively, such that $\hat{y}_1, \ldots, \hat{y}_M$ lie (componentwise) between upper and lower quantization cell boundary vectors $l_1 \leq \hat{y}_1 \leq u_1$ through $l_M \leq \hat{y}_M \leq u_M$, respectively.

Let $R_1 \subset \{1, \ldots, K\}$ be the set of indices of the descriptions received by the decoder for $\hat{y}_1$, let $R_2 \subset \{1, \ldots, K\}$ be the set of indices of the descriptions received by the decoder for $\hat{y}_2$ and so forth through $R_M$. Descriptions not received by the decoder include those that have been erased as well as not sent at all.

A reconstruction $\hat{x}$ is consistent with the received descriptions if and only if it lies in the intersection of the following M sets (where M is a number 2 or larger and a similar equation is provided for all intermediate values between 1 and M):

$$P_1 = \{x: l_{1,i} \leq (F_1 x)_i \leq u_{1,i}, \ i \in R_1\} \quad \text{(Equation 8)}$$

$$\vdots$$

$$P_M = \{x: l_{M,i} \leq (F_M x)_i \leq u_{M,i}, \ i \in R_M\} \quad \text{(Equation 9)}$$

The following steps illustrate an exemplary basic algorithm of one embodiment of the present invention for finding a consistent reconstruction of x from the received descriptions.

1. Initialization. Start from an initial point in $F_1 P_1$:
   $p_{1,i}(0)=\hat{y}_{1,i}$ if $i \in R_1$ (i.e., received descriptions) and
   $p_{1,i}(0)=0$ if $i \notin R_1$; (i.e., descriptions not received)
   and set t=0.
2. For each m=1, ..., M−1 in turn
   a. Transform $p_m(t)$ into the coordinate system of $F_{m+1}$:
      $\tilde{p}_{m+1}(t)=F_{m+1}F_m^{-1}P_m(t)=F_{m,m+1}p_m(t)$;
   b. Project $\tilde{p}_{m+1}(t)$ onto $F_{m+1}P_{m+1}$;
      $p_{m+1,i}(t)=\min\{\max\{\tilde{p}_{m+1,i}(t), l_{m+1,i}\}u_{m+1,i}\}$ if $i \in R_2$
      $p_{m+1,i}(t)=\tilde{p}_{m+1,i}(t)$ if $i \notin R_2$
3. Transform $p_M(t)$ into the coordinate system of $F_1$:
   $\tilde{p}_1(t+1)=F_1 F_M^{-1} p_M(t)=F_{M,1}p_M(t)$
4. Project $\tilde{p}_1(t+1)$ onto $F_1 P_1$:
   $p_{1,i}(t+1)=\min\{\max\{\tilde{p}_{1,i}(t+1), l_{1,i}\}, u_{1,i}\}$ if $i \in R_1$
   $p_{1,i}(t+1)=\tilde{p}_{1,i}(t+1)$ if $i \notin R_1$
5. Check for convergence. If $\|p_1(t+1)-p_1(t)\|^2>$epsilon, then set $t \leftarrow t+1$ and go to Step 2.
6. Reconstruct x.
   $\hat{x}=F_1^{-1} p_1(t+1)$.

A reasonable value for epsilon is K, so that the squared error per pixel is within one gray level.

In other embodiments, convergence is checked at other points between 1 and M, and steps 5 and 6 are replaced by the following 5' and 6':

5'. Check for convergence. If $\|p_n(t+1)-p_n(t)\|^2>$epsilon, then continue transforming and projecting until M, then set $t \leftarrow t+1$ and go to Step 2, else:
6'. Reconstruct x.
   $\hat{x}=F_n^{-1}p_n(t+1)$.

In other embodiments, step 5 (or 5') above is replaced by a loop counter, and a predetermined number of iterations is performed (e.g., twenty iterations has been found to be sufficient to achieve sufficient convergence for certain embodiments and certain channel-loss rates). In other embodiments, the number of loop iterations needed to achieve sufficient convergence is related to the number of missing coefficients in the received data $\hat{y}$, and the loop counter is set to a value based on the number missing values. Such embodiments avoid actually measuring convergence (which may take a significant amount of time), and instead use an empirically derived number of iterations that are expected to provide convergence.

In other embodiments, the initial point, the order of the projections onto the convex sets and other details inconsequential to the ultimate convergence of the algorithm may be different. However, it is understood that such variations do not depart from the spirit and scope of the present invention.

Figure 7A:
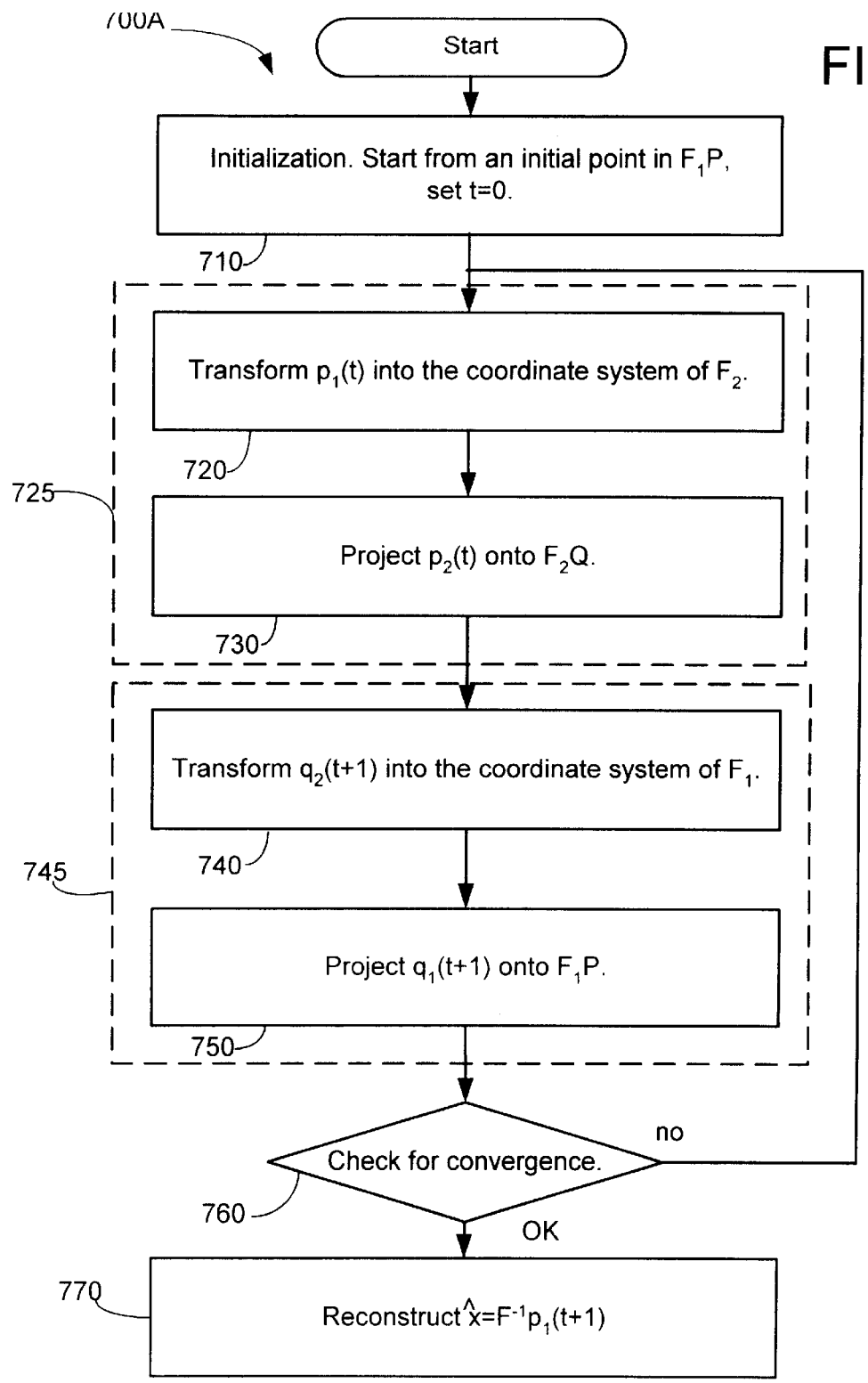
FIG. 7A is a flowchart 700A of one embodiment of the present invention.
Figure 7B:
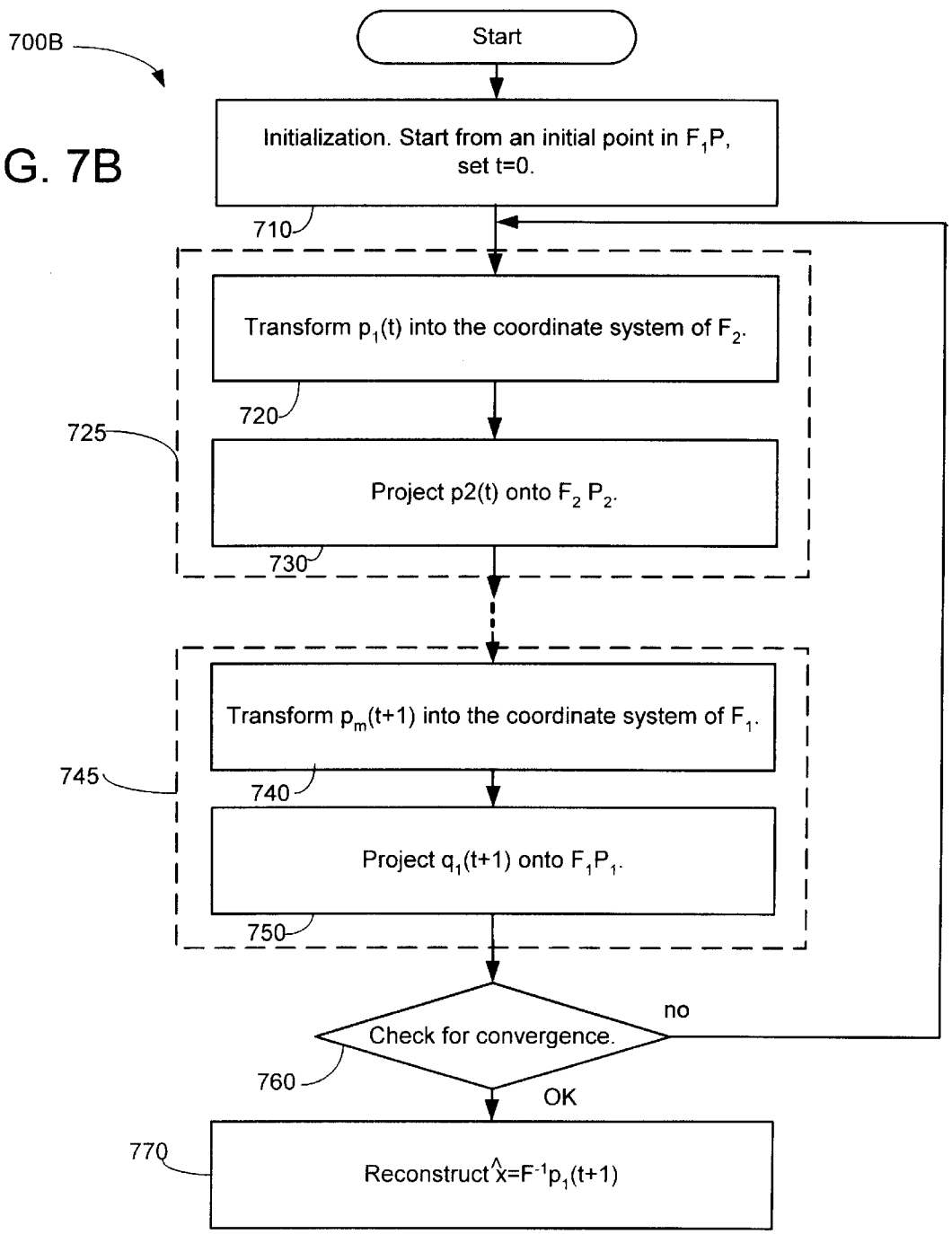
FIG. 7B is a flowchart 700B of one embodiment of the present invention.
Figure 7C:
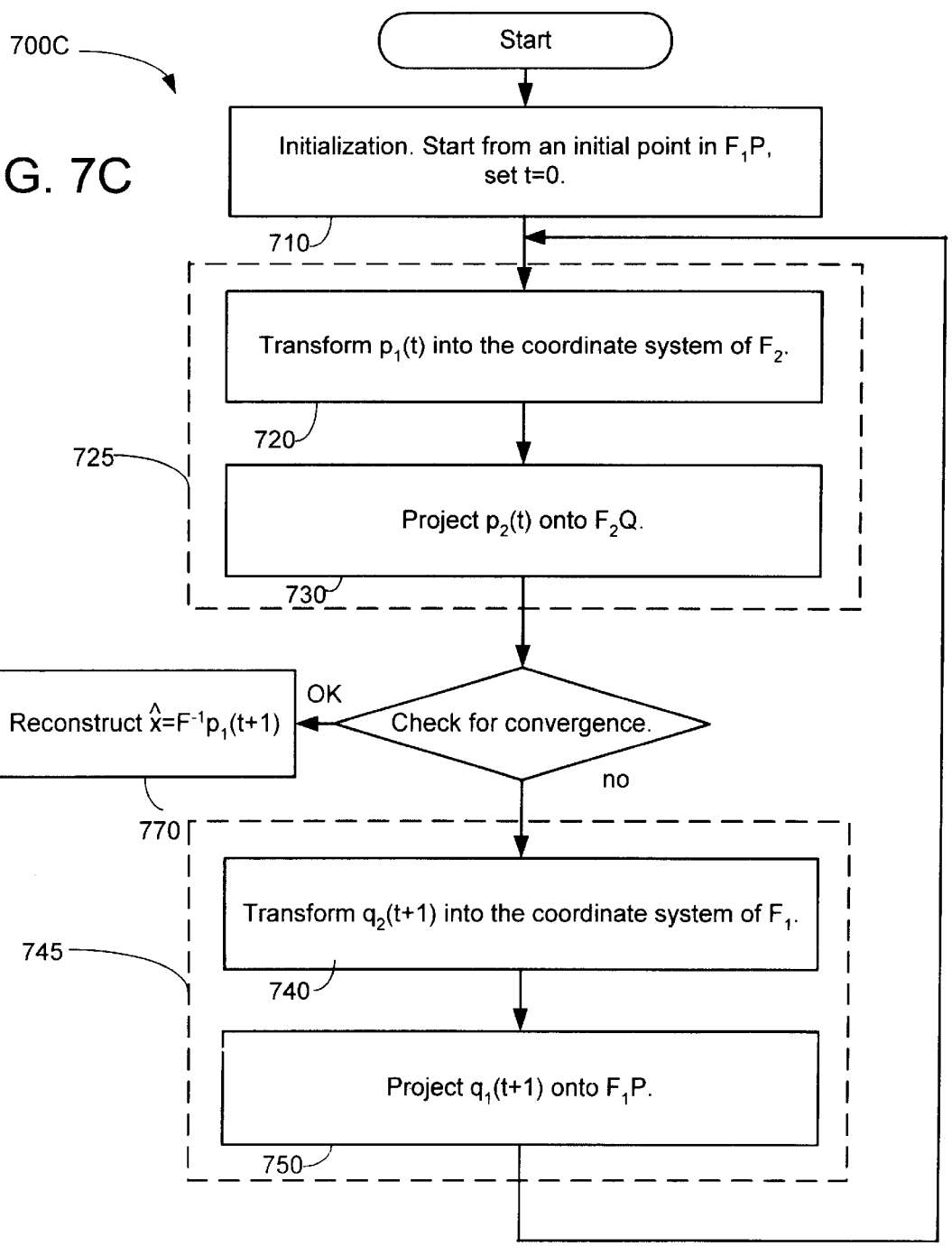
FIG. 7C is a flowchart 700C of one embodiment of the present invention.

FIG. 7A is a flowchart 700A of one embodiment of the present invention, where M=2. FIG. 7B is a flowchart 700B of another, more generalized embodiment of the present invention, where M is any number 2 or larger. FIG. 7C is a flowchart 700C of another, more generalized embodiment of the present invention, where convergence checking is performed in the middle of the loop. FIGS. 7B and 7C are otherwise identical to FIG. 7A, which will now be described. Flowchart 700A represents an embodiment used to reconstruct a set of data x̂ from a received set of data y', wherein M=2 and the received data are mapped back and forth between $F_1P$ and $F_2Q$. Block 710 performs an initialization operation to initialize a point (e.g., a vector in N dimensional space) in $F_1P$, and to set t=0. In one such embodiment, the operations set forth in Step 1 above are performed in block 710. Control then passes to block 720. Block 720 performs an operation transforming $p_1(t)$ into the coordinate system of $F_2$. In one such embodiment, the operations set forth in Step 1 above are performed in block 720. Control then passes to block 730. Block 730 performs an operation projecting $p_2(t)$ onto $F_2Q$. In one such embodiment, the operations set forth in Step 3 above are performed in block 730. In one embodiment, the functions of blocks 720 and 730 are performed as a single function, labeled block 725.

Control then passes to block 740. Block 740 performs an operation transforming $q_2(t+1)$ into the coordinate system of $F_1$. In one such embodiment, the operations set forth in Step 4 above are performed in block 740. Control then passes to block 750. Block 750 performs an operation projecting $q_1(t+1)$ onto $F_1P$. In one such embodiment, the operations set forth in Step 5 above are performed in block 750. In one embodiment, the functions of blocks 740 and 750 are performed as a single function, labeled block 745.

Control then passes to block 760. Block 760 performs an operation checking for convergence and if not sufficiently converged, then iterating blocks 720 through 760. In one such embodiment, the operations set forth in Step 6 above are performed in block 760. Control then conditionally passes to block 770 if convergence has been achieved, otherwise control passes back to block 720. Block 770 performs an operation reconstructing $x̂=F_1^{-1}p_1(t+1)$ in order to generate a recovered set of data. In one embodiment, $F_1$ and $F_2$ are each K×K transforms. In some embodiments, $F_1$ and $F_2$ are each K×K linear transforms.

In another embodiment shown in FIG. 7B, the convergence check of block 760 is performed between block 730 and block 740, with control passing conditionally to block 770 if convergence has been achieved, otherwise control passes to block 740. In this embodiment, block 770 performs an operation reconstructing $x̂=F_2^{-1}q_2(t+1)$ in order to generate a recovered set of data.

In one embodiment, the received set of data y' are the coefficients received from an erasure channel that transmitted an overcomplete expansion of an original image x, and the recovered set of data x̂ represents a reconstruction of the original image. In one such embodiment, the original image x is a portion of a larger image, for example, a 512-by-512-pixel portion of a 1024-by-1024-pixel image. In another embodiment, the original image x is a portion (e.g., one frame) of a sequence of images representing a motion picture. In another embodiment, the received set of data y' are the coefficients received froman erasure channel that transmitted an overcomplete expansion of an original audio segment x, and the recovered set of data x̂ represents a reconstruction of the original audio segment.

Figure 8A:
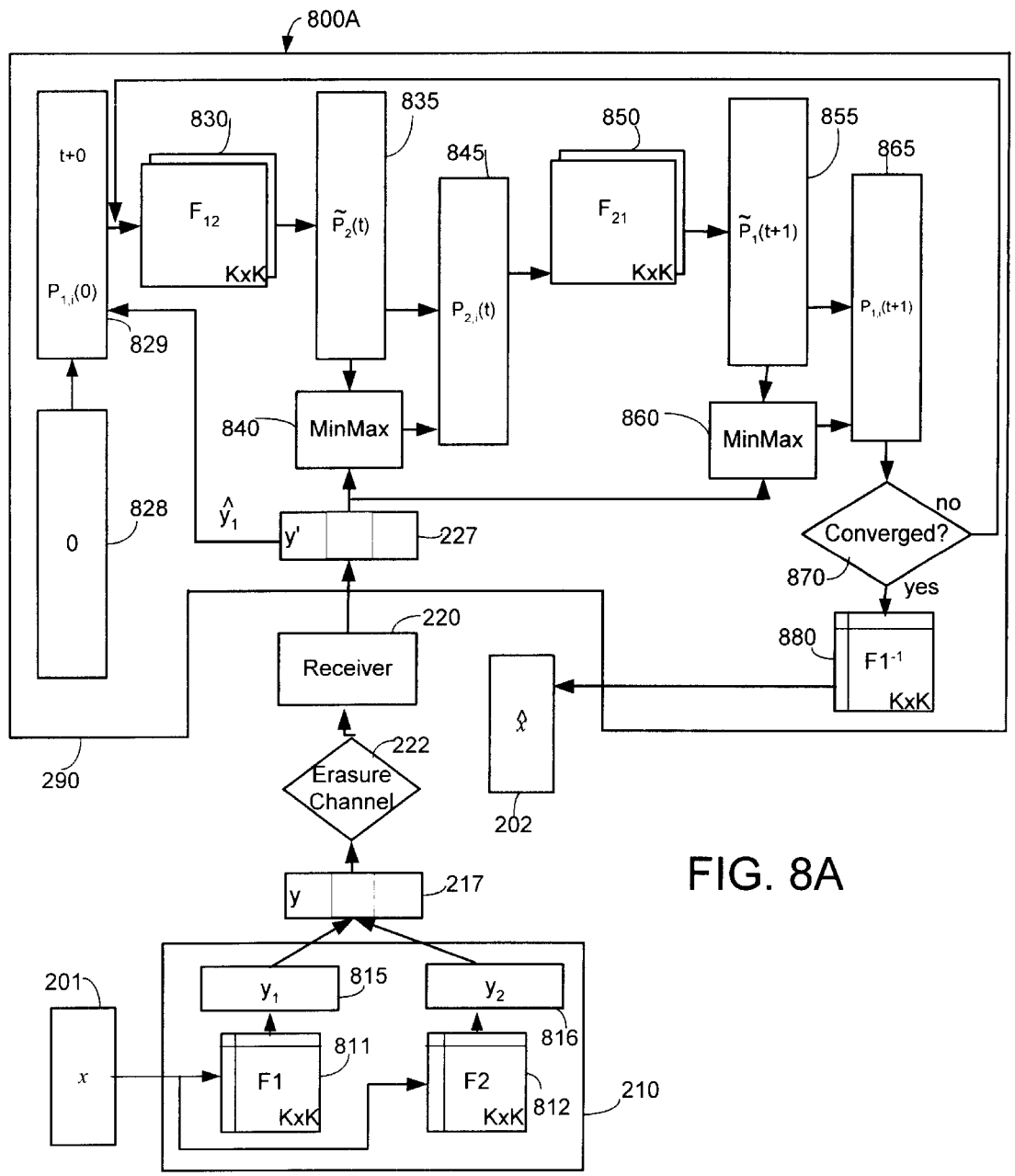
FIG. 8A is a flowchart 800A of one embodiment of the present invention.
Figure 8B:
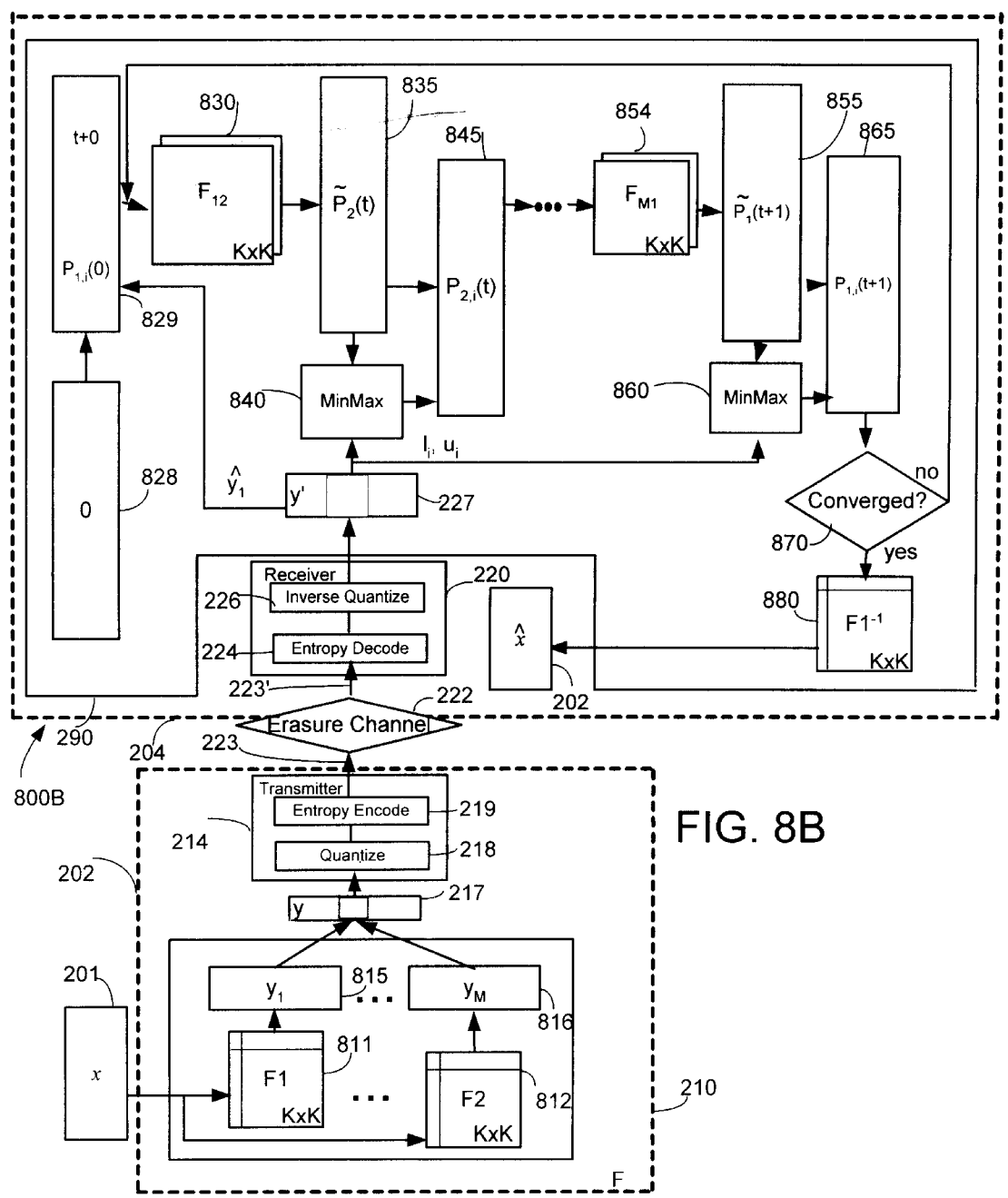
FIG. 8B is a flowchart 800B of one embodiment of the present invention.
Figure 8C:
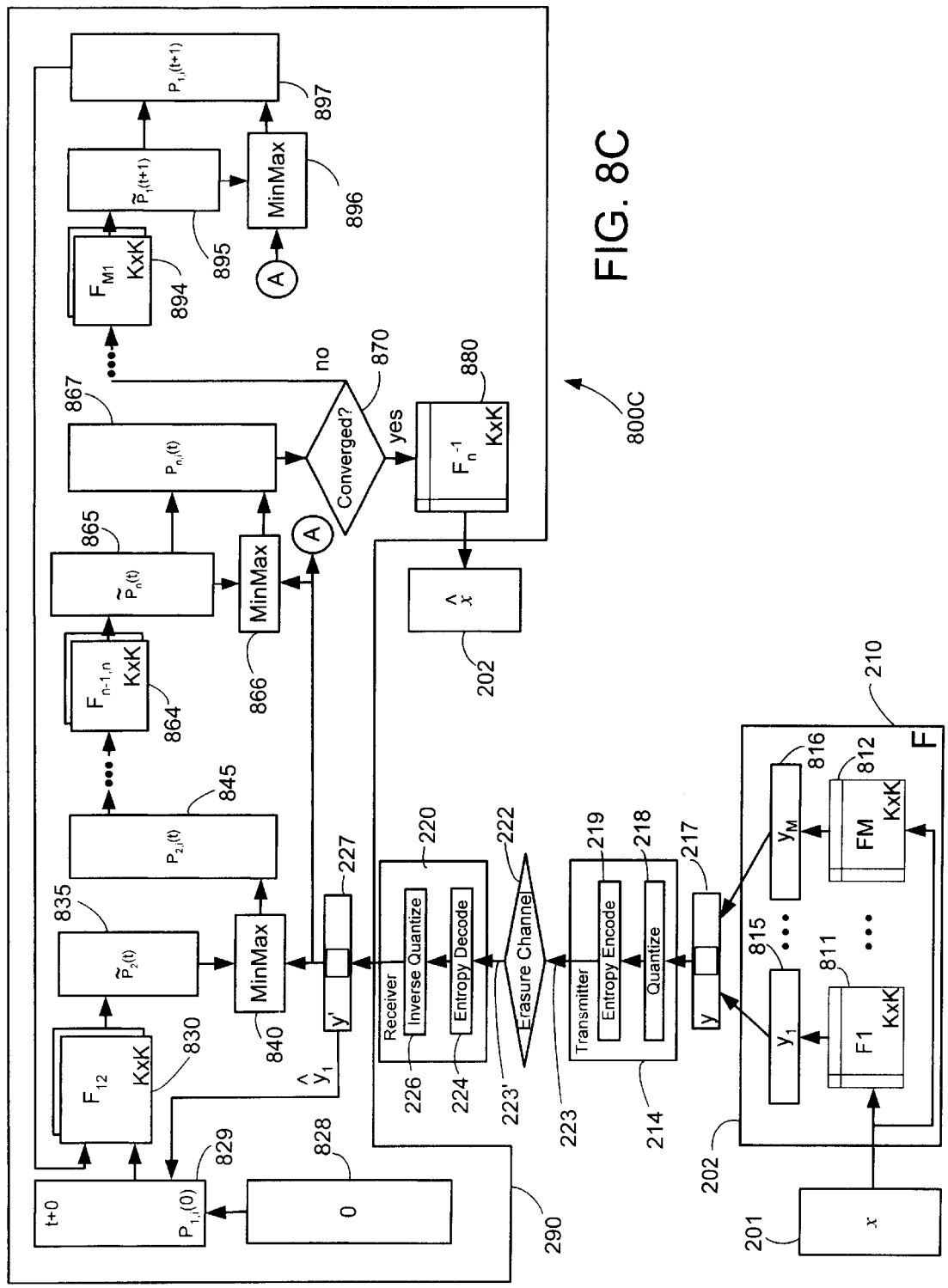
FIG. 8C is a flowchart 800C of one embodiment of the present invention.

The present invention uses any number of K×K transform functions and mappings (up to M transform-and-mapping operations) to reconstruct the received data, with typical embodiments shown in FIG. 8A, FIG. 8B, and FIG. 8C. In some embodiments, the original encoding performs an overcomplete N×K frame expansion using at least portions of each of the M transforms, as described below.

FIG. 8A is a flowchart 800A of one embodiment of the present invention for the case M=2. FIG. 8B is a flowchart 800B of one embodiment of the present invention for the general case M, where the convergence test 870 is performed after a complete set of transform-mappings. FIG. 8C is a flowchart 800C of one embodiment of the present invention for the general case M, where the convergence test 870 is performed at an arbitrary point in the transform-mappings. The term "FIG. 8" refers generally to FIG. 8A, FIG. 8B, and FIG. 8C.

Flowchart 800A represents one embodiment used to generate an overcomplete expansion y from an initial set of data x, to transmit y through a lossy channel, and then to reconstruct a set of data x̂ from a received set of data y'. Block 201 represents a set of data x that is provided. In one embodiment, set of data x is an image, for example, a 512-by-512-pixel image (which, in some embodiments, is a portion of a large image) that is to be transmitted through erasure channel 222. Block 812 performs an overcomplete N×K frame expansion such as defined in Equation 7 above to generate set of data y 217. In one such embodiment, this is accomplished by using K×K linear transform $F_1$ 811 to generate a first set of data $y_1$ 815 and K×K linear transform $F_2$ 812 to generate a second set of data $y_2$ 816. Some or all of the first set of data $y_1$ 815 and some or all of the second set of data $y_2$ 816 are concatenated to form the set of data y 217. In some embodiments, block 210 implements a N×K transform F, wherein all of the first set of data $y_1$ 815 is included in y, and N−K coefficients of the second set of data $y_2$ 816 are included. In one such embodiment, the N−K coefficients of the second set of data $y_2$ 816 implement unequal error protection as further described in a section below. In some embodiments, this provides better reconstruction of the most important aspects of x, for example, the most-significant bits of pixels of an image.

In some embodiments, the rectangular blocks of FIG. 8 (e.g., 210, 830, 880) are implemented in storage area 36 of FIG. 1 (i.e., application programs), and the rounded blocks (e.g., 201, 227, 865) are implemented in storage area 38 of FIG. 1 (i.e., program data).

The set of data y 217 is then transmitted through erasure channel 222 and received by receive block 220. In some embodiments, channel 222 is a packet network having one or more parallel paths, some of which may be more lossy than others. That is, in some embodiments, channel 222 is implemented as a plurality of parallel channels, some of which may transmit more data than others, and some of which may lose more packets than others. In one such embodiment, channel 222 will fail to transmit some of the packets (generally a random subset will be lost), and thus set of data y' has less than or equal to the corresponding coefficients of the set of data y, and the indices of the missing values of y' are known.

In some embodiments, as shown in FIG. 8B, the set of data y 217 is quantized in quantizer block 218 and entropy encoded in entropy encoder block 219, both of which are implemented in transmitter block 214, and the received binary descriptions 223' are entropy decoded by entropy decoder 224 and inverse quantized by inverse quantizer 226 both of receiver 220 (described further in the FIG. 2B description above).

In other embodiments, channel 222 is implemented as a noisy channel, in which noise will be detected in some of the received coefficients. In some such embodiments, those coefficients will be erased, and receiver 220 will mark the corresponding indices to indicate missing data, thus producing the equivalent of an erasure channel as described above, to output y' 227.

In some embodiments, channel 220 will include a storage component, for example, a digital versatile disk (DVD), onto which a series of images will be recorded (e.g., a video movie). That is, channel 222 is the process of writing and reading to the storage medium, along with any losses that occur to data on the medium over time, and losses occurring in the read process. In some such embodiments, the series of images will be recorded with conventional error recovery at a low level, and with the overcomplete expansion of the present invention at a higher level. Then, when the movie is read from the DVD, and the low-level error recover cannot recover a given packet, that packet will be indicated as "erased" or lost, and presented as such in the received set of data y' 227.

In the embodiment shown, the received set of data 227 is used as input data to the iterative process that includes 830, 840, 850, 860, 870, and 880. The recovery portion of method 800 starts by generating an initial point $p_1(0)$ 829 in $F_1P_1$ using the following equations:

$$p_{1,i}(0) = \hat{y}_{1,i} \text{ if } i \in R_1 \text{ and (i.e., description is received) and}$$

$$p_{1,i}(0) = 0 \text{ if } i \notin R_1; \text{ (i.e., description is not received)}$$

and set t=0.

Block 830 operates to transform $p_1(t)$ (829 or 865) into the coordinate system of $F_2$, effectively using the inverse transform of $F_1$ and then the $F_2$ transform. In some embodiments, this is accomplished using a single K×K transform $F_{12}$ as follows:

$$\tilde{p}_2(t) = F_2(F_1^{-1}p_1(t)) = F_{12}p_1(t).$$

Block 840 operates to project $p_2(t)$ 835 onto $F_2P_2$ as follows:

$$p_{2,i}(t) = \min\{\max\{\tilde{p}_{2,i}(t), l_{2,i}\}, u_{2,i}\} \text{ if } i \in R_2 \text{ and}$$

$$p_{2,i}(t) = \tilde{p}_{2,i}(t) \text{ if } i \in R_2.$$

Block 850 operates to transform $p_2(t)$ 845 into the coordinate system of $F_1$ as follows:

$$\tilde{p}_1(t+1) = F_1(F_2^{-1}p_2(t)) = F_{21}p_2(t).$$

Block 860 operates to project $\tilde{p}_1(t+1)$ 855 onto $F_1P_1$ as follows:

$$p_{1,i}(t+1) = \min\{\max\{\tilde{p}_{1,i}(t+1), l_{1,i}\}, u_{1,i}\} \text{ if } i \in R_1 \text{ and}$$

$$p_{1,i}(t+1) = p_{2,i}(t) \text{ if } i \in R_1.$$

In one embodiment, the "previous" version of $p_1(t)$ is kept in storage of block 829, and the "current" version $p_1(t+1)$ is kept in block 865, and blocks 829 and 865 are compared by block 870.

In FIG. 8B (which is otherwise similar to FIG. 8A), M can be other values besides 2. The initial overcomplete expansion F uses portions or all of M different functions $F_1$ through $F_M$. FIG. 8B also shows the quantization and entropy encode operations of transmitter 214 and entropy decode and inverse quantization operations of receiver 220, as described for FIG. 2B above (although not shown in FIG. 8A, some embodiments of the system of FIG. 8A also include such functions). Successive transforms and projections are performed between blocks 845 and 854. Block 854 operates to transform the resulting $p_M(t)$ into the coordinate system of $F_1$ as follows:
$\tilde{p}_1(t+1) = F_1(F_M^{-1}p_M(t+1)) = F_{M1}p_M(t+1).$ For each of FIGS. 8A and 8B, block 870 operates to check for convergence as follows:

If $\|p_1(t+1) - p_1(t)\|^2 > \in$, then set t←t+1 and go to block 830 (and, in one embodiment, load $p_1(t+1)$ from block 865 into block 829 as the next $p_1(t)$). Block 880 operates to reconstruct x into the output block $\hat{x}$ 202 as follows:

$$\hat{x} = F_1^{-1}p_1(t+1).$$

In FIG. 8C (which is otherwise similar to FIG. 8B), convergence checking is performed within the transformation-projection loop. In this embodiment, block 870 operates to check for convergence as follows: After the $F_{n-1,n}$ transform-projection of blocks 864, 865, 866, and 867, If $\|p_n(t+1) - p_n(t)\|^2 > \in$, then continue, else block 880 operates to reconstruct x into the output block $\hat{x}$ 202 as follows: $\hat{x} = F_n^{-1}p_n(t+1)$. After the $F_{M1}$ transform-projection of blocks 894, 895, 896, and 897, set t←t+1 and go to block 830 (and, in one embodiment, load $p_1(t+1)$ from block 865 into block 829 as the next $p_1(t)$).

In some embodiments, the flowchart 800 (i.e., 800A, 800B or 800C) of FIG. 8 is implemented as a software-implemented function of system 80 of FIG. 1, thus making system 80 a special-purpose machine to encode and/or decode data that goes through a lossy channel 222. In various embodiments, channel 222 includes one or more of the following: hard disk 27, removable disk 29, optical disk 31, WAN 52, and/or LAN 51. In some embodiments, the reconstructed set of data of output block $\hat{x}$ 202 includes a signal displayed as an image on monitor 47 of FIG. 1. In some embodiments, the reconstructed set of data of output block $\hat{x}$ 202 includes a signal played as a sound segment on speakers 57 of FIG. 1.

Figure 9:
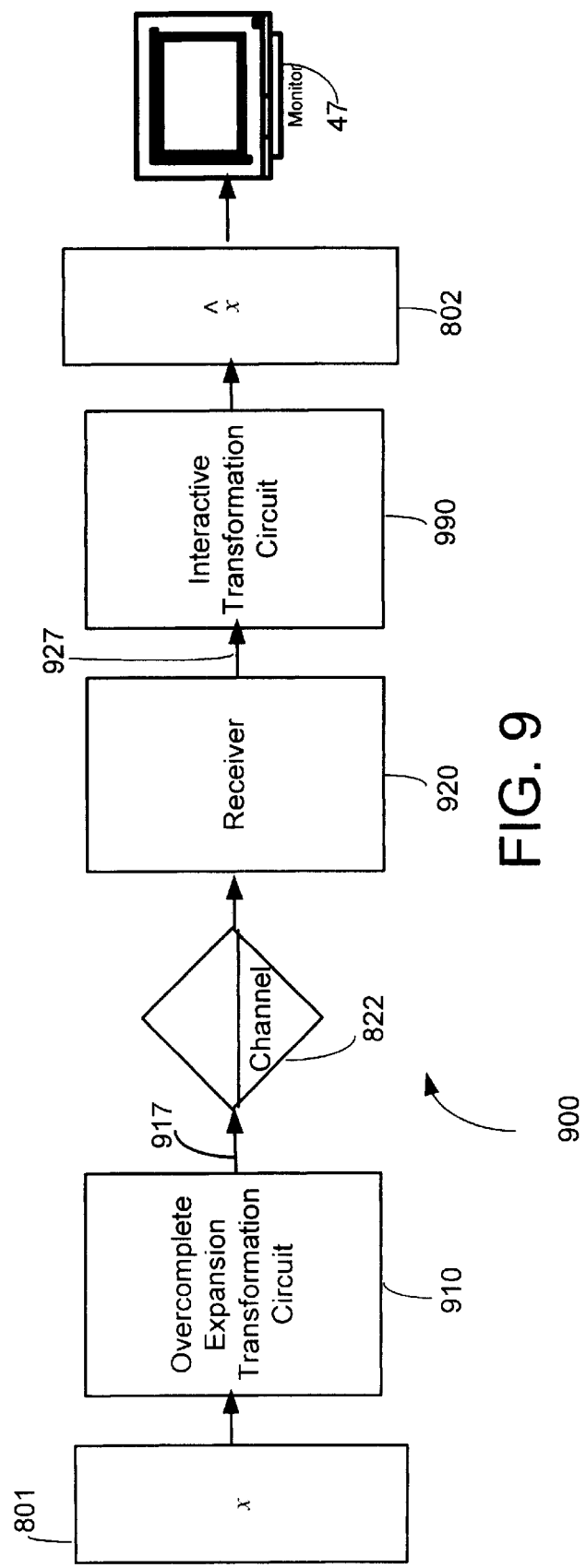
FIG. 9 is a block diagram of a circuit apparatus 900 that implements one embodiment of the present invention.

In some embodiments, as shown in FIG. 9, the present invention is implemented as an apparatus 900, and for such embodiments, FIG. 9 represents a schematic hardware block diagram. For such embodiments, overcomplete expansion transformation circuit 910 converts input set of data x 201 into overcomplete expansion data y 917. Receiver circuit 920 generates received data y' 927. In some embodiments, overcomplete expansion data y 917 and received data y' 927 are streams of data that are moved or transmitted as they are created; in other embodiments, one or both are stored in a data storage circuit such as a computer memory; in yet other embodiments, overcomplete expansion data y 917 is stored on a storage medium such as a DVD, and receiver 920 reads from the medium. Iterative transformation circuit 990 converts received data y' 927 into reconstructed data $\hat{x}$ 202. In these embodiments, blocks 910 and 990 are implemented with suitable multiplier, adder, accumulator, storage and control circuits as are well know in the computer art. In some such embodiments, reconstructed data $\hat{x}$ 202 is image data that is displayed on monitor 47.

Figure 10:
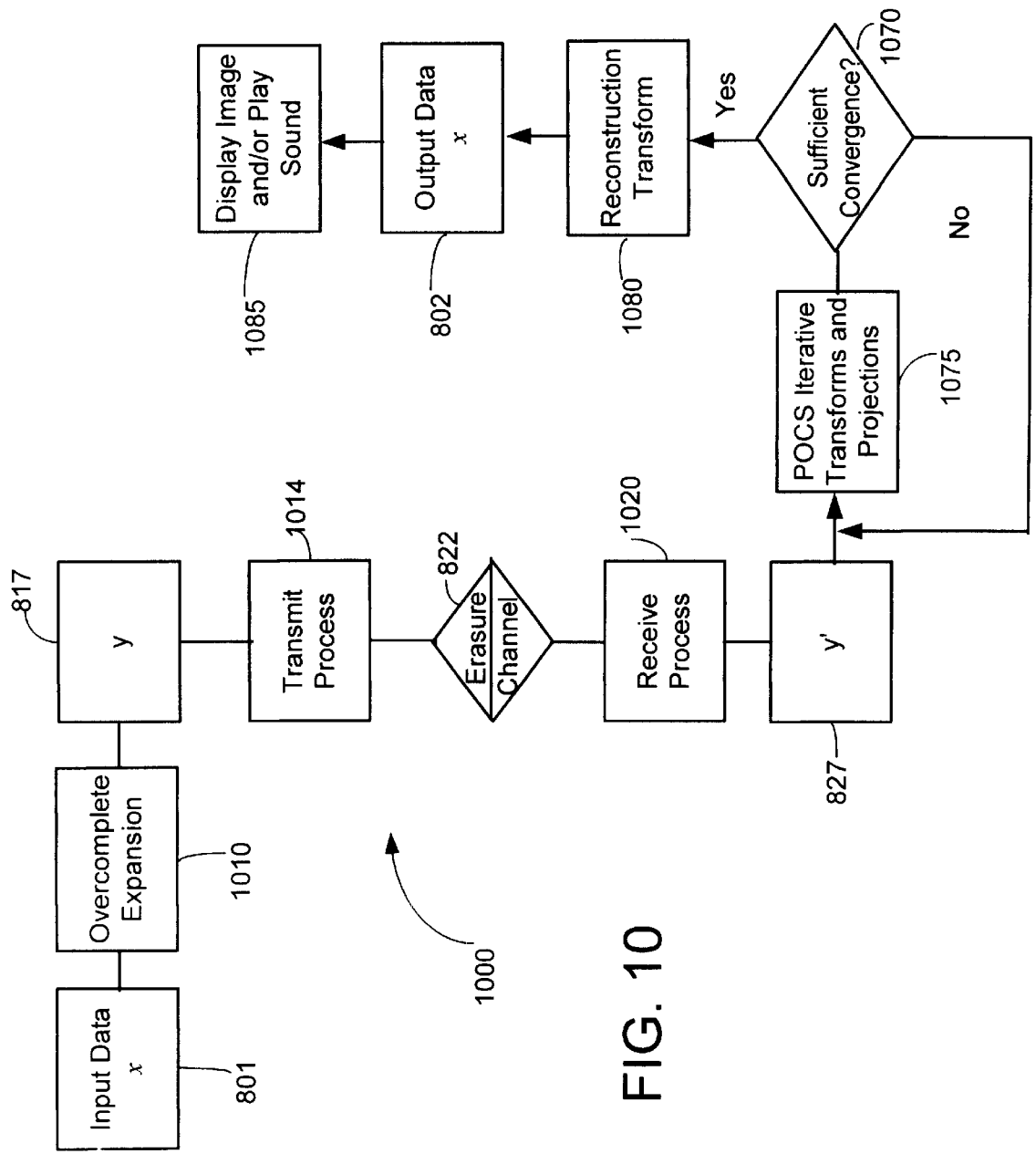
FIG. 10 is a flowchart 200 of one embodiment of the present invention.

In some embodiments, as shown in FIG. 10, the present invention is implemented as a method 1000, and for such embodiments, FIG. 10 represents a method flowchart diagram. For such embodiments, overcomplete expansion transformation module 1010 converts input set of data x 201 into overcomplete expansion data y 217. Erasure channel 222 passes some or all of data y to received data y' 227. In some embodiments, overcomplete expansion data y 217 and received data y' 227 are streams of data that are moved or transmitted as they are created; in other embodiments, one or both are stored in a data storage circuit such as a computer memory; in yet other embodiments, overcomplete expansion data y 217 is stored on a storage medium such as a DVD, and data y' 227 is read from the medium. Iterative transformation module 1075, convergence tester module 1070, and reconstruction transformation module 1080 convert received data y' 227 into reconstructed data $\hat{x}$ 202. In these embodiments, blocks 1075, 1070, and 1080 are implemented with suitable software modules as are well know in the computer art to implement the present invention as described above. In some such embodiments, reconstructed data x̂ 202 is image data that is displayed by module 1085 onto a display monitor.

In some embodiments, there are two improvements that are, either together or individually, made to this basic algorithm. The first improvement that is made in some embodiments is to reconstruct to a point in the interior of the quantization cell, rather than to a corner. Hopefully, such a reconstruction will be closer to the cell centroid. For this purpose, modify the algorithm to gradually shrink $P_1, \ldots, P_M$ towards their centers (or approximate centroids) until there is no point of intersection. That is, run the basic algorithm to convergence, increase the lower limits, decrease the upper limits, and run the basic algorithm again to convergence. The limiting points for each run, say $p_1(\infty), \ldots, p_M(\infty)$, will be equal until there is no point of intersection between $P_1, \ldots, P_M$, after which they will begin to diverge. Reconstruct x̂ from the last limiting point $p_1(\infty)$ for which $p_1(\infty)$ approximately equals $p_2(\infty), \ldots, p_M(\infty)$.

The second improvement that is made in some embodiments, when the number of received descriptions $N'=|R_1+ \ldots +|R_M|$51 is less than K, is to reconstruct missing components to their conditional expected values given the received descriptions. The basic algorithm already does this if $y_1$ has a spherical density (e.g., if the components of $y_1$ are independent identically distributed Gaussian random variables). The reason is that if $y_1$ has a spherical density, then the subvector $y_1"$ consisting of the erased components $\{y_{1,i}\}_{i \notin R_1}$ has a spherical conditional density given the received components $\{y_{1,i}\}_{i \in R_1}$. Furthermore, given the received components $\{y_{2,i}\}_{i \in R_2}$ through $\{y_{m,i}\}_{i \in R_M}$, $y_1"$ must lie in some linear ($|R_2|+ \ldots +|R_M|$) dimensional variety. Thus, the conditional density of $y_1"$ given all the received components is a spherical distribution in some linear variety with its mean at the point where the all-zero vector $y_1"=0$ projects onto the linear variety. Therefore, setting the missing components in the initial point $p_1(0)$ in Step 1 of the basic algorithm will result in their being replaced, after projection in Step 3, by their conditional means given the received descriptions. Although in most circumstances the density of $y_1$ is not spherical, it will be approximately spherical if $F_1$ is a decorrelating transform and x is preconditioned such that it has zero mean and the variance of each $y_1$ is constant. More precisely, if $\sigma_i^2$ is the variance of $(F_1x)_i$, then replace x by $F_1^{-1}$ diag $(\sigma_1^{-1}, \ldots, \sigma_K^{-1}) F_1 (x-EX)$. The resulting vector $y_1$ will have approximately spherical density.

Experimental Results

Results are presented using the given algorithm to reconstruct a K dimensional vector x. In one test, vector x is originally formed by taking the inverse DCT (discrete cosine transform; see the book by M. Vetterli and J. Kovačević, *Wavelets and Subband Coding*, Prentice Hall, 1995; page 340, page 374; herein "Vetterli et al." which provides a general reference for various types of transforms used in various embodiments of the present invention.) of a vector of transform coefficients $y_1$, which are in turn sampled from a Gaussian distribution with mean 0 and diagonal covariance with entries inversely proportional to frequency, i.e., $Y_{1,k} \sim N(0, \sigma^2/(1+ck))$, k=0, 1, . . . , k−1, where $\sigma^2$ and c are constants. The vector x is then transformed using a DCT for $F_1$ and the identity transform for $F_2$, yielding $y_1$=DCT(x) and $y_2$=x. The transform coefficient vectors $y_1$ and $y_2$ are uniformly scalar quantized using a step size of Δ. In one experiment, K=512, $\sigma^2$=1.0, Δ=0.1, and c=0.013, so that the variance of the last coefficient is $\sigma^2/8$.

Vetterli et al. (page 374) provides the following definitions of the DCT used in one embodiment of the present invention:

$$y_0 = \frac{1}{\sqrt{(N)}} \sum_{n=0}^{N-1} x_n \quad \text{(Equation 10)}$$

$$y_k = \sqrt{\frac{2}{N}} \sum_{n=0}^{N-1} x_n \cos\left(\frac{2\pi(2n+1)k}{4N}\right), \quad \text{(Equation 11)}$$

$$k = 1, \ldots, N-1$$

All of the quantized coefficients $\hat{y}_1$ are transmitted, along with ¼ of the quantized coefficients $\hat{y}_2$ (randomly selected), for a redundancy of N/K=1.25. Of these 640 transmitted coefficients, random subsets are received. The reconstruction algorithm is run for each subset received. The performance of the algorithm is measured by averaging the reconstruction error over all subsets having the same number of coefficients. The performance of a comparable forward-error-correction system is also obtained. If the number of coefficients received in the FEC system is not enough to reconstruct the vector, then only the systematic portion of the received coefficients is used.

Figure 4:
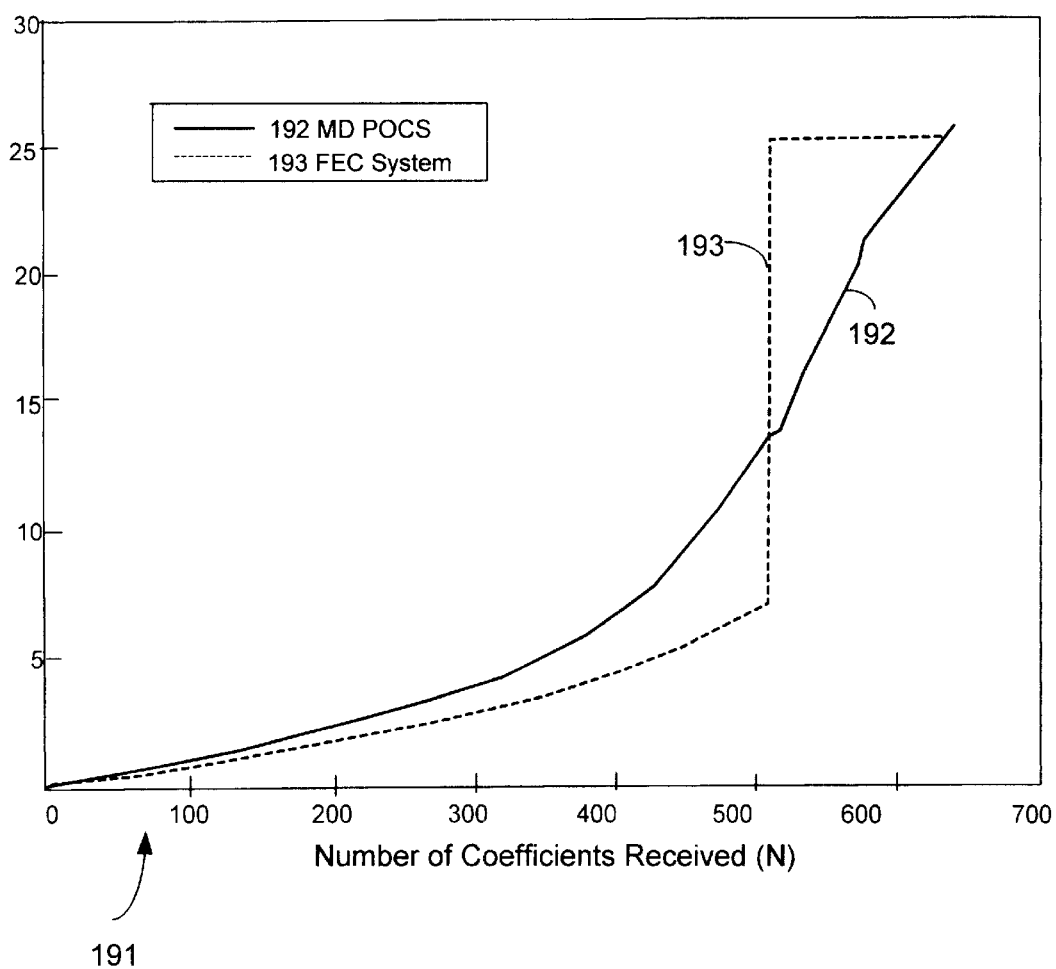
FIG. 4 is a graphical representation of the sound-to-noise ratio (SNR) comparison of an MD POCS reconstruction according to the present invention versus that of an FEC system.

A plot of N" vs. SNR 191 (signal-to-noise ratio) in dB (decibels) is shown in FIG. 4. There is a slight gain with the present system (as indicated by graph line 192) over the plain FEC system (as indicated by graph line 193) if all the coefficients are received. If fewer than K coefficients are received, then the present system always outperforms the FEC system. However, there is substantial loss if exactly K coefficients are received. This is due to the fact that the partition induced by the received coefficients is usually not cubic since there is a mixture of coefficients from the two transforms. Also, the point found by the POCS algorithm is not necessarily the centroid of the cell. The exact value of the loss is somewhat arbitrary; performance of the FEC system when more than K coefficients are received can be made as high as desired by reducing Δ, whereas performance of even the optimal reconstruction when fewer than K coefficients are received reaches an upper bound independent of Δ.

Figure 6:
FIG. 6 is a recovered image of Lena that had one-eighth of the components missing (erasures).

FIG. 6 shows an image 593 of "Lena" with POCS. (Reconstruction from an overcomplete representation with redundancy 1.25, with ⅛ of the transmitted components missing.)

Figure 5:
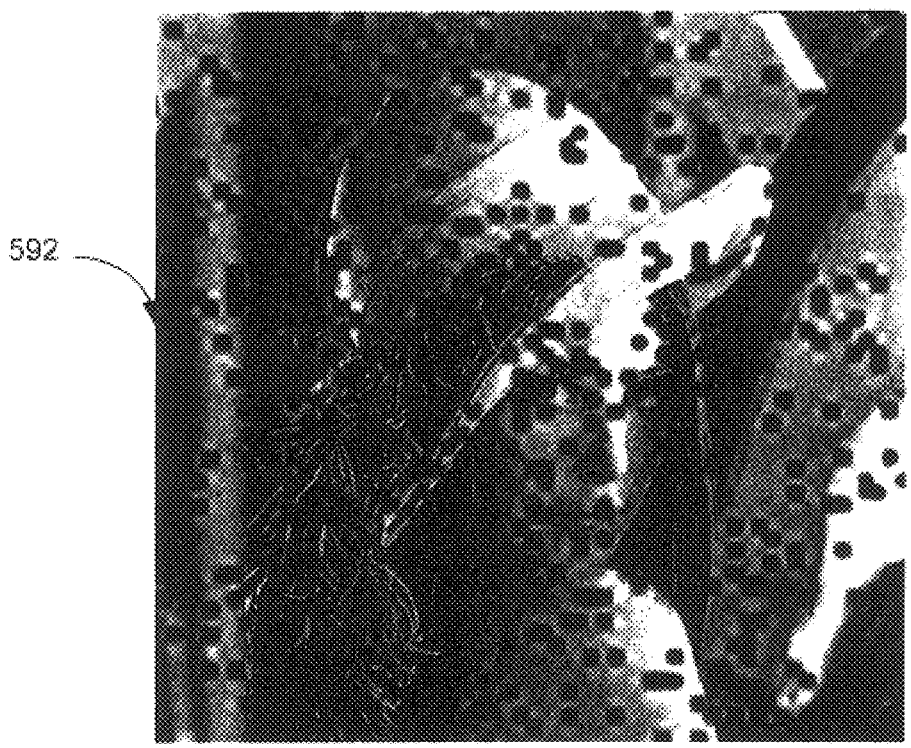
FIG. 5 is a recovered image of Lena that had one-eighth of the components missing (erasures).

Experimental results are also provided for an image called Lena, using for $F_1$ a three-level dyadic separable 2D (two-dimensional) wavelet transform based on the 9/7 filter of (M. Antonini, M. Barlaud, P. Mathieu, and I. Daubechies. Image coding using wavelet transform. *IEEE Trans. Image Processing*, 1:205–221, April 1992; herein "Antonini et al."), and using for $F_2$ the separable 2D DCT. The coefficients are uniformly scalar quantized to a stepsize of 16. All of the coefficients of $\hat{y}_1$ are transmitted, along with the coefficients of $\hat{y}_2$ corresponding to the lower half horizontal frequencies and the lower half vertical frequencies, for a redundancy of N/K=1.25. Of these transmitted coefficients, ⅛ are erased at random. FIG. 6 shows the reconstruction. The reconstruction error in this example is 30.69 dB, compared to 15.68 dB if the same ⅛ of the wavelet coefficients are erased without benefit of being reconstructed from the extra coefficients from $F_2$, as shown in FIG. 5 (an image 592 of "Lena" having missing coefficients for ⅛ of the pixels). However, this compares to 37.77 dB if the wavelet coefficients $y_1=F_1x$ are all received in their entirety.

In summary, the present invention provides a POCS-based algorithm for consistent reconstruction from multiple descriptions of overcomplete expansions. The algorithm operates in the data space $R^K$ rather than in the expanded space $R^N$, N>K. By constructing the frame from two complete transform bases, all projections can be expressed in terms of forward or inverse transforms. Since such transforms are usually efficient to compute, the present invention can perform the reconstruction much faster than with previous methods. Indeed, the method of one embodiment enables overcomplete frame expansions of an entire image, which has heretofore not been possible.

The present invention represents a POCS-based algorithm for consistent reconstruction of a signal $x \in R^K$ from any subset of quantized coefficients $y \in R^N$ in an N×K overcomplete frame expansion y=Fx, N=MK (where M is two or larger). By choosing the frame operator F to be the concatenation of two or more K×K invertible transforms, the projections may be computed in $R^K$ using only the transforms and their inverses, rather than in the larger space $R^N$ using the pseudo-inverse as proposed in earlier work. This enables practical reconstructions from overcomplete frame expansions based on wavelet, subband, or lapped transforms (one or more of which are used in some of the various embodiments of the present invention) of an entire image, which has heretofore not been possible.

Unequal Error Protection

The present invention also provides a method and apparatus for unequal error protection for multiple description source coding. By analogy, this can be compared with unequal error protection for error-correction codes. In particular, given a bit-plane representation of the coefficients in an overcomplete representation of the source, one embodiment of the present invention provides coding the most significant bits with the highest redundancy and the least significant bits with the lowest redundancy. In one embodiment, this is accomplished by varying the quantization stepsize for the different coefficients. Then, in some embodiments, the available received quantized coefficients are reconstructed using a method based on alternating projections onto convex sets (or other suitable method) as described above.

In multiple-description quantization using overcomplete (frame) expansions as described above, an input signal $x \in R^K$ is represented by a vector $y=Fx \in R^N$, where N>K. F is a so-called "frame operator," whose N rows span $R^K$. The coefficients of y are scalar quantized to obtain ŷ and then are independently entropy coded and transmitted in (up to) N descriptions. The decoder receives descriptions of only N'≦N coefficients after potential erasures, and reconstructs the signal from the received descriptions. Each received description is an encoding of the fact that some coefficient $y_i$ lies in a particular quantization interval, say $[l_i, u_i)$.

In the description above, a practical method and system are presented for consistent reconstruction of x given any subset of the transmitted quantization intervals $[l_i, u_i)$, where l≦Fx<u (pointwise). In some embodiments of the method and/or system, F has the form $$F = \begin{bmatrix} F_1 \\ F_2 \end{bmatrix}$$

where $F_1$ is a K×K transform, and $F_2$ is another K×K transform, orthogonally related to $F_1$ (i.e., $F_2=QF_1$ for some orthogonal transform Q). For example, $F_1$ may be a wavelet transform (over an image $x \in R^K$. suitably extended), and $F_2$ may be the identity transform, another wavelet transform, or the same wavelet transform over a 1-pixel shift of the image. The algorithm used by the present invention reconstructs x from the received quantization intervals $[l_i, u_i)$ using alternating projections onto convex sets. The notation "$[l_i, u_i)$" indicates the interval greater than or equal to $l_i$ and less than $u_i$.

Figure 11:
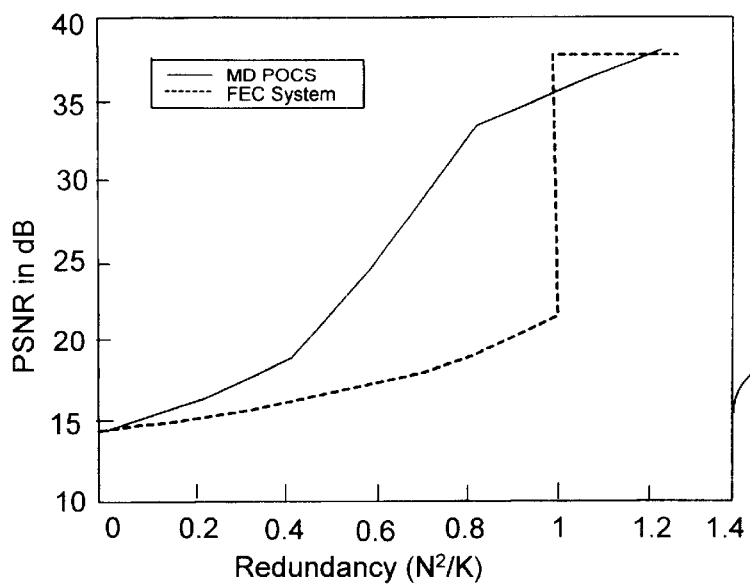
FIG. 11 shows peak signal to noise ratio results for Lena showing reconstruction results for equal error protection.
Figure 12:
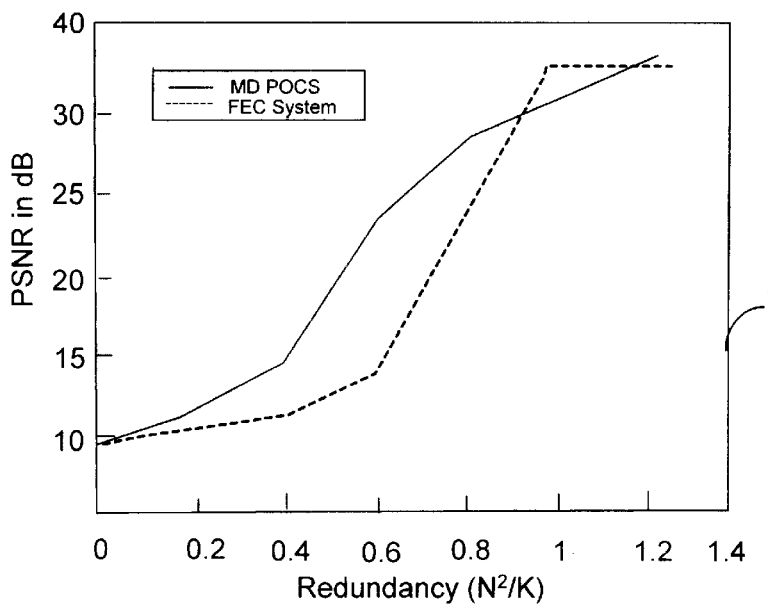
FIG. 12 shows reconstruction results for unequal error protection.

In the description above, multiple-description quantization is compared using the above reconstruction algorithm to a systematic error-correction code, in a hypothetical transmission system. In the hypothetical transmission system, the coefficients in the K-dimensional vector $y_1=F_1 x$ are uniformly scalar quantized to B bits of precision, and are separately transmitted in K B-bit descriptions. Redundancy is provided by transmitting an additional N−K B-bit descriptions. In the multiple-description case, the additional descriptions encode the first N−K coefficients of the real vector $y_2=F_2 x$ uniformly scalar quantized to B bits of precision. In one embodiment, reconstruction is performed by the aforementioned algorithm. In the error-correction case, the additional packets contain the N−K B-bit parity check symbols from the finite field $GF(2^B)$ generated by a systematic (N, K) error-correction code. Reconstruction is given by $\hat{x}=F_1^{-1}\hat{y}_1$ when N−K or fewer packets are lost. When more than N−K packets are lost, reconstruction is given by the same formula, with the lost coefficients set to zero in $\hat{y}_1$. Results are generated in both cases by simulating random reception of N' out of N descriptions (in repeated trials) for N'=0, . . . , N. FIGS. 11 and 12 show PSNR (peak signal-to-noise ratio) results for Lena comparing multiple-description and error control coding, with FIG. 11 showing reconstruction results for equal protection and FIG. 12 showing reconstruction results for unequal error protection. FIG. 11 shows the expected squared reconstruction error in each case as a function of N', for the image called "Lena". Here, $F_1$ is the 9/7 biorthogonal wavelet transform and $F_2$ is the separable full-image DCT. When N'<K, MD (Multiple Description) quantization outperforms error-correction coding (ECC) by up to 14 dB, while for N≧K (except at N'=N), error-correction coding outperforms MD quantization by up to 3 dB. The 3 dB loss for MD quantization is apparently due to the fact that the quantization cells in the signal domain are not cubic since the received coefficients correspond to a mixture of basis functions from the transforms $F_1$ and $F_2$ and hence are not orthonormal.

The above comparison is somewhat unfair to the error-correction coding approach, because, as is well known, better performance can be achieved by protecting different bits with different redundancies. If the bits of each quantized coefficient are labeled 1, . . . , B from the least to the most significant, then loss of the bth bit increases the squared error of the reconstruction in proportion to $2^{2b}$. Indeed, if $\epsilon_K(N)$ is the probability that an (N,K) code cannot recover a symbol, then the optimal redundancy N/K for coding the bth bit is approximately given by $2^{2b}\epsilon'_K(N)$=constant, where $\epsilon'_K(N)$ is the slope of $\epsilon_K(N)$ at N. This is a classic bit-allocation problem whose solution gives the optimal allocation of parity bits to different bit planes of the transform coefficients so as to minimize the expected squared-reconstruction error. Unequal error protection has been employed in other contexts.

Figure 13:
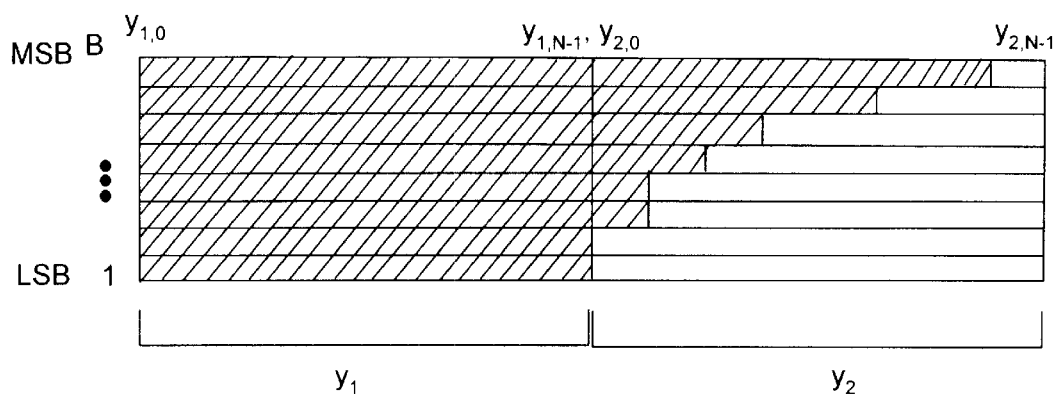
FIG. 13 shows components of the vectors $y_1=F_1x$ and $y_2=F_2x$ depicting which bits are to be transmitted in one embodiment of unequal error protection

This section describes embodiments that include unequal error protection for multiple-description quantization. One embodiment of the present invention is illustrated in FIG. 13 that shows components of the vectors $y_1=F_1 x$ and $y_2=F_2 x$ depicting which bits are to be transmitted in one embodiment of unequal error protection. The components of the vectors $y_1=F_1 x$ and $y_2=F_2 x$ are depicted in a sequence from left to right, while the bits of each component are depicted from most to least significant, top to bottom. The shaded region shows which bits are to be transmitted. All of the bits from the coefficients $y_1$ are transmitted, while only some of the bits from the coefficient $y_2$ are transmitted. Looked at in one way, each bit plane (or row of bits) has its own redundancy. The most significant bits have the highest redundancy while the least significant bits have the lowest redundancy. Looked at in another way, each coefficient is quantized to its own number of bits. All of the coefficients of $y_1$ are quantized to B bits, but the ith coefficient of $y_2$ is quantized to $b_i \leq B$ bits, with $b_i$ decreasing to 0 as the index i of the coefficient increases. The quantized coefficients are transmitted as usual; a random number of them are erased. In one embodiment, the reconstruction procedure, using the iterative algorithm of the present invention, does not change, except for the fact that the received quantization intervals $[l_i, u_i]$ now vary in width to reflect the unequal stepsizes for the different coefficients. These stepsizes need not be related by powers of two. Thus, in some embodiments, the stepsizes are related by powers of two; and in other embodiments, the stepsizes are not related by powers of two.

FIG. 12 shows the expected squared reconstruction error of multiple-description quantization and error control coding analogous to FIG. 11, except that the redundant bits have been reallocated to different bit planes to provide unequal error protection. The gains are about 1 to 2 dB over the equal error protection case. The allocation of redundant bits is the same in both MD and ECC cases. Reconstruction in the error control case assumes that if a bit is lost, then all less significant bits within the same coefficient are lost as well.

In some embodiments of the present invention, algorithms for determining the optimal allocation of redundant bits in the multiple-description case are determined empirically.

It should be noted that unequal error protection in multiple description coding by varying the quantization precision across coefficients can be used very generically, with any kind of overcomplete transform F and any kind of reconstruction method. Two instances of prior art in which such unequal error protection has been used are the following.

In W. Jiang and A. Ortega, "Multiple description coding via polyphase transform and selective quantization," SPIE Conf. on Visual Communications and Image Processing, Janaury 1999, F is the concatenation of two identical K×K transforms, $F_1$ and $F_2$. The coefficients in $F_2$ are quantized to lower resolution than the coefficients in $F_1$. Reconstruction is performed simply by replacing the coefficients missing from $F_1$ with the corresponding low-resolution coefficients from $F_2$.

In A. C. Miguel, A. E. Mohr, and E. A. Riskin, "SPIHT for generalized multiple description coding," submitted to IEEE Int'l Conf. on Image Processing, Kobe, Japan, 1999, F is the concatenation of four identical K×K transforms, $F_1, \ldots, F_4$. The coefficients in $F_1$ are quantized to full precision (10 bit planes). The coefficients in $F_2$, $F_3$, and $F_4$, are quantized to 7, 5, and 4 bit planes, respectively, and grouped so that corresponding coefficients do not share the same binary description. Reconstruction is performed simply by replacing the coefficients missing from $F_1$ with the corresponding low resolution coefficients from $F_2$, $F_3$, or $F_4$.

One feature that distinguishes this invention from prior art is that in this invention the transforms $F_i$, for i>1, do not equal $F_1$. In other words, if F is the overcomplete frame expansion for the multiple description system of this invention, then the last N−K coefficients are not equal to the first K coefficients, before quantization.

Conclusion—Reconstruction of Missing Coefficients

One aspect of the present invention provides a computerized method of reconstructing a set of data x having K dimensions. The method includes receiving (220) a set of data y', wherein the set of data y' corresponds to a set of data y but with some coefficients missing, wherein the set of data y has N dimensions and represents an overcomplete transformation of the set of data x, and wherein N>K and the set of data y' has ≦N dimensions; and iteratively transforming (890) the received set of data y' using projections onto convex sets as calculated with a computer to produce a set of data x' representing the reconstructed set of data x.

In one embodiment, the method further includes providing (201) an initial set of data x having K dimensions, overcompletely transforming (812) the set of data x to a set of data y having N dimensions, where N>K; and transmitting (222) the set of data y on a channel.

In another embodiment of the method, the transmitting on the channel further includes storing the set of data y onto a storage medium; and reading the set of data y from the medium.

In yet another embodiment of the method, the iteratively transforming calculation further includes:
  transforming a set of data $y_1$ to a set of data $y_2$ using $F_2 F_1^{-1}$,
  setting components of the resulting set of data $y_2$ corresponding to received components to those received components $y_2'$,
  transforming the resulting set of data $y_2$ to a set of data $y_1$ using $F_1 F_2^{-1}$,
  setting components of the resulting set of data $y_1$ corresponding to received components to those received components $y_1'$, and
  transforming the resulting set of data $y_1$ to a set of data x' using $F_1^{-1}$,
wherein $F_1$ and $F_2$ are each K×K transforms.

In still another embodiment of the method (this embodiment involving two functions $F_1$ and $F_2$), the iteratively transforming calculation further comprises:
(a) initializing a t=0;
(b) setting an initial point $p_1(0)$ such that for each index i,
  $p_{1,i}(0) = \hat{y}_{1,i}$ if $i \in R_1$ and
  $p_{1,i}(0) = 0$ if $i \notin R_1$;
(c) transforming $p_1(t)$ into the coordinate system of $F_2$ using
  $p_2(t) = F_2(F_1^{-1} p_1(t)) = F_{12} p_1(t)$;
(d) projecting $p_2(t)$ onto $F_2 Q$ such that for each index i,
  $q_{2,i}(t+1) = \min\{\max\{p_{2,i}(t), l_{2,i}\}, u_{2,i}\}$ if $i \in R_2$ and
  $q_{2,i}(t+1) = p_{2,i}(t)$ if $i \notin R_2$;
(e) transforming $q_2(t+1)$ into the coordinate system of $F_1$ using
  $q_1(t+1) = F_1(F_2^{-1} q_2(t+1)) = F_{21} q_2(t+1)$;
(f) projecting $q_1(t+1)$ onto $F_1 P$ such that for each index i,
  $p_{1,i}(t+1) = \min\{\max\{q_{1,i}(t+1), l_{1,i}\}, u_{1,i}\}$ if $i \in R_1$ and
  $p_{1,i}(t+1) = p_{2,i}(t)$ if $i \notin R_1$; and
(g) reconstructing a set of data $\hat{x} = F_1^{-1} p_1(t)$;
wherein: $F_1$ and $F_2$ are each K×K transforms, $F_1^{-1}$ is the inverse transform of $F_1$, $F_2^{-1}$ is the inverse transform of $F_2$, $\hat{y}_1$ is a quantized version of $y_1$, $\hat{y}_2$ is a quantized version of $y_2$, such that $\hat{y}_1$ componentwise lies between respective lower and upper quantization cell boundary vectors $l_1 \leq \hat{y}_1 \leq u_1$ and $\hat{y}_2$ componentwise lies between respective lower and upper quantization cell boundary vectors $l_2 \leq \hat{y}_2 \leq u_2$, $R_1 \subset \{1, \ldots, K\}$ is the set of indices of the descriptions received of $\hat{y}_1$, and $R_2 \subset \{1, \ldots, K\}$ is the set of indices of the descriptions received of $\hat{y}_2$. In one such embodiment, the iteratively transforming calculation further includes (f1) checking for convergence by testing $\|p_1(t+1)-p_1(t)\|^2 > \epsilon$, and if so then setting $t \leftarrow t+1$ and iterating (c) through (f). In one embodiment, $F_1$ is a wavelet transform and $F_2$ is a discrete cosine transform.

In still another embodiment of the method (this embodiment involving M functions $F_1$ through $F_M$), the iteratively transforming calculation further comprises:
(a) initializing a t=0;
(b) setting $p_{1,i}(0)=\hat{y}_{1,i}$ if $i \in R_1$ (i.e., received descriptions) and $p_{1,i}(0)=0$ if $i \notin R_1$; (i.e., descriptions not received)
(c) for each m=1, . . . , M−1 in turn:
 (i) transforming $p_m(t)$ into the coordinate system of $F_{m+1}$:
  $\tilde{p}_{m+1}(t)=F_{m+1}F_m^{-1}P_m(t)=F_{m,m+1}p_m(t)$; and
 (ii) projecting $\tilde{p}_{m+1}(t)$ onto $F_{m+1}P_{m+1}$:
  $p_{m+1,i}(t)=\min\{\max\{\tilde{p}_{m+1,i}(t), l_{m+1,i}\}u_{m+1,i}\}$ if $i \in R_2$
  $p_{m+1,i}(t)=\tilde{p}_{m+1,i}(t)$ if $i \notin R_2$
(d) transforming $p_M(t)$ into the coordinate system of $F_1$:
 $\tilde{p}_1(t+1)=F_1F_M^{-1}p_M(t)=F_{M,1}p_M(t)$
(e) projecting $\tilde{p}_1(t+1)$ onto $F_1P_1$:
 $p_{1,i}(t+1)=\min\{\max\{\tilde{p}_{1,i}(t+1), l_{1,i}\}, u_{1,i}\}$ if $i \in R_1$
 $p_{1,i}(t+1)=\tilde{p}_{1,i}(t+1)$ if $i \notin R_1$
(f) checking for convergence, and if $\|p_n(t+1)-p_n(t)\|^2 >$ epsilon for an n between 1 and M inclusive, then setting $t \leftarrow t+1$ and repeating (c) through (f), otherwise performing (g); and
(g) reconstructing x:
 $\hat{x}=F_n^{-1}p_n(t+1)$;
wherein: $F_1$ through $F_M$ are each K×K transforms, M is an integer larger than 1, each $F_m^{-1}$ is the inverse transform of $F_m$, $\hat{y}_1$ is a quantized version of $y_1$, such that $\hat{y}_1$ componentwise lies between respective lower and upper quantization cell boundary vectors $l_1 \leq \hat{y}_1 \leq u_1$ and each $\hat{y}_m$ componentwise lies between respective lower and upper quantization cell boundary vectors $l_m \leq \hat{y}_m \leq u_m$, $R_1 \subset \{1, \ldots, K\}$ is the set of indices of the descriptions received of $\hat{y}_1$, and for each m, $R_m \subset \{1, \ldots, K\}$ is the set of indices of the descriptions received of $\hat{y}_m$.

Another aspect of the present invention is a computer readable medium having computer executable instructions stored thereon for performing a method of reconstructing a set of data x having K dimensions. The method includes receiving a set of data y', wherein the set of data y' corresponds to a set of data y but with some coefficients missing, wherein the set of data y has N dimensions and represents an overcomplete transformation of the set of data x, and wherein N>K, and iteratively transforming the received set of data y' using projections onto convex sets as calculated with a computer to produce a set of data x' representing the reconstructed set of data x. In various embodiments, this computer medium includes instructions to implement the various features of the previously described method.

Yet another aspect of the present invention provides a data-reconstruction system that includes means for receiving a set of data y', wherein the set of data y' corresponds to a set of data y but with some coefficients missing, wherein the set of data y has N dimensions and represents an overcomplete transformation of the set of data x, and wherein N>K; and means, operatively coupled to the means for receiving, for iteratively transforming the received set of data y' using projections onto convex sets to produce a set of data x' representing the reconstructed set of data x.

In one embodiment of the system, the means for the iteratively transforming calculation further comprises:
(a) means for initializing a t=0;
(b) means for setting an initial point $p_1(0)$ such that for each index i,
 $p_{1,i}(0)=\hat{y}_{1,i}$ if $i \in R_1$ and
 $p_{1,i}(0)=0$ if $i \notin R_1$;
(c) means for transforming $p_1(t)$ into the coordinate system of $F_2$ using
 $p_2(t)=F_2(F_1^{-1}p_1(t))=F_{12}p_1(t)$;
(d) means for projecting $p_2(t)$ onto $F_2Q$ such that for each index i,
 $q_{2,i}(t+1)=\min\{\max\{p_{2,i}(t), l_{2,i}\}, u_{2,i}\}$ if $i \in R_2$ and
 $q_{2,i}(t+1)=p_{2,i}(t)$ if $i \notin R_2$;
(e) means for transforming $q_2(t+1)$ into the coordinate system of $F_1$ using
 $q_1(t+1)=F_1(F_2^{-1}q_2(t+1))=F_{21}q_2(t+1)$;
(f) means for projecting $q_1(t+1)$ onto $F_1P$ such that for each index i,
 $p_{1,i}(t+1)=\min\{\max\{q_{1,i}(t+1), l_{1,i}\}, u_{1,i}\}$ if $i \in R_1$ and
 $p_{1,i}(t+1)=p_{2,i}(t)$ if $i \notin R_1$; and
(g) means for reconstructing a set of data $\hat{x}=F_1^{-1}p_1(t)$;
wherein: $F_1$ and $F_2$ are each K×K transforms, $F_1^{-1}$ is the inverse transform of $F_1$, $F_2^{-1}$ is the inverse transform of $F_2$, $\hat{y}_1$ is a quantized version of $y_1$, $\hat{y}_2$ is a quantized version of $y_2$, such that $\hat{y}_1$ componentwise lies between respective lower and upper quantization cell boundary vectors $l_1 \leq \hat{y}_1 \leq u_1$ and $\hat{y}_2$ componentwise lies between respective lower and upper quantization cell boundary vectors $l_2 \leq \hat{y}_2 \leq u_2$, $R_1 \subset \{1, \ldots, K\}$ is the set of indices of the descriptions received of $\hat{y}_1$, and $R_2 \subset \{1, \ldots, K\}$ is the set of indices of the descriptions received of $\hat{y}_2$.

In another embodiment of the system, the means for iteratively transforming further includes (f1) means for checking for convergence including means for testing $\|p_1(t+1)-p_1(t)\|^2 > \epsilon$, and means for setting $t \leftarrow t+1$ and iterating means (c) through (f) if so.

In still another embodiment of the system, the means for iteratively transforming includes:
(a) means for initializing a t=0;
(b) means for setting
 $p_{1,i}(0)=\hat{y}_{1,i}$ if $i \in R_1$ (i.e., received descriptions) and
 $p_{1,i}(0)=0$ if $i \notin R_1$; (i.e., descriptions not received)
(c) for each m=1, . . . , M−1 in turn:
 (i) means for transforming $p_m(t)$ into the coordinate system of $F_{m+1}$:
  $\tilde{p}_{m+1}(t)=F_{m+1}F_m^{-1}P_m(t)=F_{m,m+1}p_m(t)$; and
 (ii) means for projecting $\tilde{p}_{m+1}(t)$ onto $F_{m+1}P_{m+1}$:
  $p_{m+1,i}(t)=\min\{\max\{\tilde{p}_{m+1,i}(t), l_{m+1,i}\}u_{m+1,i}\}$ if $i \in R_2$
  $p_{m+1,i}(t)=\tilde{p}_{m+1,i}(t)$ if $i \notin R_2$
(d) means for transforming $p_M(t)$ into the coordinate system of $F_1$:
 $\tilde{p}_1(t+1)=F_1F_M^{-1}p_M(t)=F_{M,1}p_M(t)$
(e) means for projecting $\tilde{p}_1(t+1)$ onto $F_1P_1$:
 $p_{1,i}(t+1)=\min\{\max\{\tilde{p}_{1,i}(t+1), l_{1,i}\}, u_{1,i}\}$ if $i \in R_1$
 $p_{1,i}(t+1)=\tilde{p}_{1,i}(t+1)$ if $i \notin R_1$
(g) means for checking for convergence, and if $\|p_n(t+1)-p_n(t)\|^2 >$ epsilon for an n between 1 and M inclusive, then means for setting $t \leftarrow t+1$ and repeating (c) through (f), otherwise means for going to (g); and
(g) means for reconstructing x:
 $\hat{x}=F_n^{-1}p_n(t+1)$;
wherein: $F_1$ through $F_M$ are each K×K transforms, M is an integer larger than 1, each $F_m^{-1}$ is the inverse transform of $F_m$, $\hat{y}_1$ is a quantized version of $y_1$, such that $\hat{y}_1$ componentwise lies between respective lower and upper quantization cell boundary vectors $l_1 \leq \hat{y}_1 \leq u_1$ and each $\hat{y}_m$ componentwise lies between respective lower and upper quantization cell boundary vectors $l_m \leq \hat{y}_m \leq u_m$, $R_1 \subset \{1, \ldots, K\}$ is the set of indices of the descriptions received of $\hat{y}_1$, and for each m, $R_m \subset \{1, \ldots, K\}$ is the set of indices of the descriptions received of $\hat{y}_m$.

Still another aspect of the present invention provides a computerized method of reconstructing data after a transmission on an erasure channel. This method includes providing an initial set of data x having K dimensions, overcompletely transforming the set of data x to a set of data y having N dimensions, where N>K, transmitting the set of data y on the channel, receiving a set of data y' from the channel, and iteratively transforming the received set of data y' using projections onto convex sets that use at least two different K×K transforms. Various embodiments of this method include one or more features of the methods described above.

Thus, the present invention provides a computationally efficient and workable reconstruction of data sets having missing coefficients from overcomplete expansions. Examples of large data sets for which the present invention is suitable include images and/or sound sent over erasure channels such as packet networks, or stored on optical disks. One contribution of the present invention is the proper setup within the multiple description problem so that it becomes computationally feasible for solving the problems of interest.

In some of the method embodiments, the methods are performed in the order listed. Other embodiments use different orders.

This application is intended to cover any adaptations or variations of the present invention. It is manifestly intended that this invention be limited only by the claims and equivalents thereof.

What is claimed is:

1. A computerized method of reconstructing a set of data x having K dimensions, the method comprising:
   receiving a set of data y', wherein the set of data y' corresponds to a set of data y but with some coefficients missing, wherein the set of data y has N dimensions and represents an overcomplete transformation of the set of data x, and wherein N>K; and
   iteratively transforming the received set of data y' using projections onto K-dimensional convex sets as calculated with a computer to produce a set of data $\hat{x}$ representing the reconstructed set of data x.

2. The method of claim 1, further comprising
   providing an initial set of data x having K dimensions;
   overcompletely transforming the set of data x to a set of coefficients y having N dimensions, where N>K;
   quantizing the coefficients of y to obtain indices j such that each coefficient $y_{1,i}$ lies in the $j_i^{th}$ quantization region and each one of the indices j correspond to a respective quantization region;
   entropy coding the indices j to obtain binary descriptions; and
   transmitting the binary descriptions on a channel.

3. The method of claim 2 wherein the transmitting on the channel further comprises:
   storing the binary descriptions onto a storage medium; and
   reading the binary descriptions from the storage medium.

4. The method of claim 1, wherein the iteratively transforming calculation further comprises:
   transforming a set of data $y_1$ to a set of data $y_2$ using $F_2 F_1^{-1}$,
   setting components of the resulting set of data $y_2$ corresponding to received components to those received components $y_2'$,
   transforming the resulting set of data $y_2$ to a set of data $y_1$ using $F_1 F_2^{-1}$,
   setting components of the resulting set of data $y_1$ corresponding to received components to those received components $y_1'$, and
   transforming the resulting set of data $y_1$ to a set of data x' using $F_1^{-1}$, wherein $F_1$ and $F_2$ are each K×K transforms.

5. The method of claim 1, wherein the iteratively transforming calculation farther comprises:
   (a) initializing a t=0;
   (b) setting an initial point $p_1(0)$ such that for each index i,
      $p_{1,i}(0)=\hat{y}_{1,i}$ if $i \in R_1$ and
      $p_{1,i}(0)=0$ if $i \notin R_1$;
   (c) transforming $p_1(t)$ into the coordinate system of $F_2$ using
      $p_2(t)=F_2(F_1^{-1}p_1(t))=F_{12}p_1(t)$;
   (d) projecting $p_2(t)$ onto $F_2 Q$ such that for each index i,
      $q_{2,i}(t+1)=\min\{\max\{p_{2,i}(t),l_{2,i}\}, u_{2,i}\}$ if $i \in R_2$ and
      $q_{2,i}(t+1)=p_{2,i}(t)$ if $i \notin R_2$;
   (e) transforming $q_2(t+1)$ into the coordinate system of $F_1$ using
      $q_1(t+1)=F_1(F_2^{-1}q_2(t+1))=F_{21}q_2(t+1)$;
   (f) projecting $q_1(t+1)$ onto $F_1 P$ such that for each index i,
      $p_{1,i}(t+1)=\min\{\max\{q_{1,i}(t+1),l_{1,i}\}, u_{1,i}\}$ if $i \in R_1$; and
      $p_{1,i}(t+1)=p_{2,i}(t)$ if $i \notin R_1$; and
   (g) reconstructing a set of data $\hat{x}=F_1^{-1}p_1(t)$;
   wherein:
      $F_1$ and $F_2$ are each K×K transforms,
      $F_1^{-1}$ is the inverse transform of $F_1$, $F_2^{-1}$ is the inverse transform of $F_2$,
      $\hat{y}_1$ is a quantized version of $y_1$, $\hat{y}_2$ is a quantized version of $y_2$, such that $\hat{y}_1$ componentwise lies between respective lower and upper quantization cell boundary vectors $l_1 \leq \hat{y}_1 \leq u_1$ and $\hat{y}_2$ componentwise lies between respective lower and upper quantization cell boundary vectors $l_2 \leq \hat{y}_2 \leq u_2$,
      $R_1 \subset \{1, \ldots, K\}$ is the set of indices of the descriptions received of $\hat{y}_1$, and
      $R_2 \subset \{1, \ldots, K\}$ is the set of indices of the descriptions received of $\hat{y}_2$.

6. The method of claim 5, wherein the iteratively transforming calculation further comprises:
   (f1) checking for convergence by testing $\|p_1(t+1)-p_1(t)\|^2 > \epsilon$, and if so then setting $t \leftarrow t+1$ and iterating (c) through (f).

7. The method of claim 6, wherein $F_1$ is a wavelet transform and $F_2$ is a discrete cosine transform.

8. The method of claim 1, wherein the iteratively transforming calculation further comprises:
   (a) initializing a t=0;
   (b) setting $p_{1,i}(0)=\hat{y}_{1,i}$ if $i \in R_1$ (i.e., received descriptions) and
      $p_{1,i}(0)=0$ if $i \notin R_1$; (i.e., descriptions not received)
   (c) for each m=1, ..., M−1 in turn:
      (i) transforming $p_m(t)$ into the coordinate system of $F_{m+1}$:
         $\tilde{p}m+1(t)=F_{m+1}F_m^{-1}P_m(t)=F_{m,m+1}p_m(t)$; and
      (ii) projecting $\tilde{p}_{m+1}(t)$ onto $F_{m+1}P_{m+1}$:
         $p_{m+1,i}(t)=\min\{\max\{\tilde{p}_{m+1,i}(t), l_{m\ 1,i}\}u_{m+1,i}\}$ if $i \in R_2$
         $p_{m+1,i}(t)=\tilde{p}_{m+1,i}(t)$ if $i \notin R_2$ (d) transforming $p_M(t)$ into the coordinate system of $F_1$:

$\tilde{p}_1(t+1)=F_1F_M^{-1}p_M(t)=F_{M,1}p_M(t)$ (e) projecting $\tilde{p}_1(t+1)$ onto $F_1P_1$:

$p_{1,i}(t+1)=\min\{\max\{\tilde{p}_{1,i}(t+1),\, l_{1,i}\},\, u_{1,i}\}$ if $i\in R_1$ $p_{1,i}(t+1)=\tilde{p}_{1,i}(t+1)$ if $i\notin R_1$ (h) checking for convergence, and if $\|p_n(t+1)-p_n(t)\|^2>$epsilon for an n between 1 and M inclusive, then setting $t\leftarrow t+1$ and repeating (c) through (f), otherwise performing (g); and (g) reconstructing x:

$\hat{x}=F_n^{-1}p_n(t+1);$ wherein:

$F_1$ through $F_M$ are each K×K transforms,

M is an integer larger than 1, each $F_m^{-1}$ is the inverse transform of $F_m$, $\hat{y}_1$ is a quantized version of $y_1$, such that $\hat{y}_1$ componentwise lies between respective lower and upper quantization cell boundary vectors $l_1\leq \hat{y}_1\leq u_1$ and each $\hat{y}_m$ componentwise lies between respective lower and upper quantization cell boundary vectors $l_m\leq \hat{y}_m\leq u_m$, $R_1\subset \{1,\ldots,K\}$ is the set of indices of the descriptions received of $\hat{y}_1$, and for each m, $R_m\subset \{1,\ldots,K\}$ is the set of indices of the descriptions received of $\hat{y}_m$.

9. A computer readable medium having computer executable instructions stored thereon for performing a method of reconstructing a set of data x having K dimensions, the method comprising:

receiving a set of data y', wherein the set of data y' corresponds to a set of data y but with some coefficients missing, wherein the set of data y has N dimensions and represents an overcomplete transformation of the set of data x, and wherein N>K; and iteratively transforming the received set of data y' using projections onto convex sets as calculated with a computer to produce a set of data x' representing the reconstructed set of data x.

10. The medium of claim 9, further including instructions such that the iteratively transforming further comprises:

(a) initializing a t=0;

(b) setting an initial point $p_1(0)$ such that for each index i, $p_{1,i}(0)=\hat{y}_{1,i}$ if $i\in R_1$ and $p_{1,i}(0)=0$ if $i\notin R_1$;

(c) transforming $p_1(t)$ into the coordinate system of $F_2$ using $p_2(t)=F_2(F_1^{-1}p_1(t))=F_{12}p_1(t);$ (d) projecting $p_2(t)$ onto $F_2Q$ such that for each index i, $q_{2,i}(t+1)=\min\{\max\{p_{2,i}(t),l_{2,i}\},\, u_{2,i}\}$ if $i\in R_2$ and $q_{2,i}(t+1)=p_{2,i}(t)$ if $i\notin R_2$;

(e) transforming $q_2(t+1)$ into the coordinate system of $F_1$ using $q_1(t+1)=F_1(F_2^{-1}q_2(t+1))=F_{21}q_2(t+1);$ (f) projecting $q_1(t+1)$ onto $F_1P$ such that for each index i, $p_{1,i}(t+1)=\min\{\max\{q_{1,i}(t+1),l_{1,i}\},u_{1,i}\}$ if $i\in R_1$ and $p_{1,i}(t+1)=p_{2,i}(t)$ if $i\notin R_1$; and (g) reconstructing a set of data $\hat{x}=F_1^{-1}p_1(t);$ wherein:

$F_1$ and $F_2$ are each K×K transforms, $F_1^{-1}$ is the inverse transform of $F_1$, $F_2^{-1}$ is the inverse transform of $F_2$, $\hat{y}_1$ is a quantized version of $y_1$, $\hat{y}_2$ is a quantized version of $y_2$, such that $\hat{y}_1$ componentwise lies between respective lower and upper quantization cell boundary vectors $l_1\leq \hat{y}_1\leq u_1$ and $\hat{y}_2$ componentwise lies between respective lower and upper quantization cell boundary vectors $l_2\leq \hat{y}_2\leq u_2$, $R_1\subset \{1,\ldots,K\}$ is the set of indices of the descriptions received of $\hat{y}_1$, and $R_2\subset \{1,\ldots,K\}$ is the set of indices of the descriptions received of $\hat{y}_2$.

11. The medium of claim 10, further including instructions such that the iteratively transforming calculation further comprises:

(f1) checking for convergence by testing $\|p_1(t+1)-p_1(t)\|^2>\epsilon$, and if so then setting $t\leftarrow t+1$ and iterating (c) through (f).

12. The medium of claim 9, further including instructions such that the iteratively transforming further comprises:

(a) initializing a t=0;

(b) setting $p_{1,i}(0)=\hat{y}_{1,i}$ if $i\in R_1$ (i.e., received descriptions) and $p_{1,i}(0)=0$ if $i\notin R_1$; (i.e., descriptions not received)

(c) for each m=1, ..., M−1 in turn:

(i) transforming $p_m(t)$ into the coordinate system of $F_{m+1}$:

$\tilde{p}_{m+1}(t)=F_{m+1}F_m^{-1}P_m(t)=F_{m,m+1}p_m(t);$ and (ii) projecting $\tilde{p}_{m+1}(t)$ onto $F_{m+1}P_{m+1}$:

$p_{m+1,i}(t)=\min\{\max\{\tilde{p}m+1,i(t),\, l_{m+1,i}\}u_{m+1,i}\}$ if $i\in R_2$ $p_{m+1,i}(t)=\tilde{p}_{m+1,i}(t)$ if $i\notin R_2$ (d) transforming $p_M(t)$ into the coordinate system of $F_1$:

$\tilde{p}_1(t+1)=F_1F_M^{-1}p_M(t)=F_{M,1}p_M(t)$ (e) projecting $\tilde{p}_1(t+1)$ onto $F_1P_1$:

$p_{1,i}(t+1)=\min\{\max\{\tilde{p}_{1,i}(t+1),\, l_{1,i}\},\, u_{1,i}\}$ if $i\in R_1$ $p_{1,i}(t+1)=\tilde{p}_{1,i}(t+1)$ if $i\notin R_1$ (i) checking for convergence, and if $\|p_n(t+1)-p_n(t)\|^2>$epsilon for an n between 1 and M inclusive, then setting $t\leftarrow t+1$ and repeating (c) through (f), otherwise performing (g); and (g) reconstructing x:

$\hat{x}=F_n^{-1}p_n(t+1);$ wherein:

$F_1$ through $F_M$ are each K×K transforms,

M is an integer larger than 1, each $F_m^{-1}$ is the inverse transform of $F_m$, $\hat{y}_1$ is a quantized version of $y_1$, such that $\hat{y}_1$ componentwise lies between respective lower and upper quantization cell boundary vectors $l_1\leq \hat{y}_1\leq u_1$ and each $\hat{y}_m$ componentwise lies between respective lower and upper quantization cell boundary vectors $l_m\leq \hat{y}_m\leq u_m$, $R_1\subset \{1,\ldots,K\}$ is the set of indices of the descriptions received of $\hat{y}_1$, and for each m, $R_m\subset \{1,\ldots,K\}$ is the set of indices of the descriptions received of $\hat{y}_m$.

13. A data-reconstruction system comprising:

means for receiving a set of data y', wherein the set of data y' corresponds to a set of data y but with some coefficients missing, wherein the set of data y has N dimensions and represents an overcomplete transformation of the set of data x, and wherein N>K; and means, operatively coupled to the means for receiving, for iteratively transforming the received set of data y' using projections onto convex sets to produce a set of data x' representing the reconstructed set of data x.

14. The system of claim 13, wherein the means for iteratively transforming calculation further comprises:

(a) means for initializing a t=0;

(b) means for setting an initial point $p_1(0)$ such that for each index i, $p_{1,i}(0)=\hat{y}_{1,i}$ if $i\in R_1$ and $p_{1,i}(0)=0$ if $i\notin R_1$;

(c) means for transforming $p_1(t)$ into the coordinate system of $F_2$ using $p_2(t)=F_2(F_1^{-1}p_1(t))=F_{12}p_1(t)$;
(d) means for projecting $p_2(t)$ onto $F_2Q$ such that for each index i,
$q_{2,i}(t+1)=\min\{\max\{p_{2,i}(t),l_{2,i}\}, u_{2,i}\}$ if $i \in R_2$ and
$q_{2,i}(t+1)=p_{2,i}(t)$ if $i \notin R_2$;
(e) means for transforming $q_2(t+1)$ into the coordinate system of $F_1$ using
$q_1(t+1)=F_1(F_2^{-1}q_2(t+1))=F_{21}q_2(t+1)$;
(f) means for projecting $q_1(t+1)$ onto $F_1P$ such that for each index i,
$p_{1,i}(t+1)=\min\{\max\{q_{1,i}(t+1), l_{1,i}\},u_{1,i}\}$ if $i \in R_1$ and
$p_{1,i}(t+1)=p_{2,i}(t)$ if $i \notin R_1$; and
(g) means for reconstructing a set of data $\hat{x}=F_1^{-1}p_1(t)$;
wherein:
  $F_1$ and $F_2$ are each K×K transforms,
  $F_1^{-1}$ is the inverse transform of $F_1$, $F_2^{-1}$ is the inverse transform of $F_2$,
  $\hat{y}_1$ is a quantized version of $y_1$, $\hat{y}_2$ is a quantized version of $y_2$, such that $\hat{y}_1$ componentwise lies between respective lower and upper quantization cell boundary vectors $l_1 \leq \hat{y}_1 \leq u_1$ and $\hat{y}_2$ componentwise lies between respective lower and upper quantization cell boundary vectors $l_2 \leq \hat{y}_2 \leq u_2$,
  $R_1 \subset \{1, \ldots, K\}$ is the set of indices of the descriptions received of $\hat{y}_1$, and
  $R_2 \subset \{1, \ldots, K\}$ is the set of indices of the descriptions received of $\hat{y}_2$.

15. The system of claim 14, wherein the means for iteratively transforming further comprises:
(f1) means for checking for convergence including means for testing
$\|p_1(t+1)-p_1(t)\|^2 > \epsilon$, and means for setting $t \leftarrow t+1$ and iterating means (c) through (f) if so.

16. The system of claim 13, wherein the means for iteratively transforming calculation further comprises:
(a) means for initializing a t=0;
(c) means for setting
  $p_{1,i}(0)=\hat{y}_{1,i}$ if $i \in R_1$ (i.e., received descriptions) and
  $p_{1,i}(0)=0$ if $i \notin R_1$; (i.e., descriptions not received)
(c) for each m=1, ..., M−1 in turn:
  (i) means for transforming $p_m(t)$ into the coordinate system of $F_{m+1}$:
  $\tilde{p}_{m+1}(t)=F_{m+1}F_m^{-1}P_m(t)=F_{m,m+1}p_m(t)$; and
  (ii) means for projecting $\tilde{p}_{m+1}(t)$ onto $F_{m+1}P_{m+1}$:
  $p_{m+1,i}(t)=\min\{\max\{\tilde{p}_{m+1,i}(t), l_{m+1,i}\}u_{m+1,i}\}$ if $i \in R_2$
  $p_{m+1,i}(t)=\tilde{p}_{m+1,i}(t)$ if $i \notin R_2$
(d) means for transforming $p_M(t)$ into the coordinate system of $F_1$:
$\tilde{p}_1(t+1)=F_1F_M^{-1}p_M(t)=F_{M,1}p_M(t)$
(e) means for projecting $\tilde{p}_1(t+1)$ onto $F_1P_1$:
  $p_{1,i}(t+1)=\min\{\max\{\tilde{p}_{1,i}(t+1), l_{1,i}\}, u_{1,i}\}$ if $i \in R_1$
  $p_{1,i}(t+1)=\tilde{p}_{1,i}(t+1)$ if $i \notin R_1$
(j) means for checking for convergence, and if $\|p_n(t+1)-p_n(t)\|^2 >$ epsilon for an n between 1 and M inclusive,
  then means for setting $t \leftarrow t+1$ and repeating (c) through (f), otherwise means for going to (g); and
(g) means for reconstructing x.
$\hat{x}=F_n^{-1}p_n(t+1)$;
wherein:
  $F_1$ through $F_M$ are each K×K transforms,
  M is an integer larger than 1,
  $F_m^{-1}$ is the inverse transform of $F_m$,
  $\hat{y}_1$ is a quantized version of $y_1$, such that $\hat{y}_1$ componentwise lies between respective lower and upper quantization cell boundary vectors $l_1 \leq \hat{y}_1 \leq u_1$ and each $\hat{y}_m$ componentwise lies between respective lower and upper quantization cell boundary vectors $l_m \leq \hat{y}_m \leq u_m$,
  $R_1 \subset \{1, \ldots, K\}$ is the set of indices of the descriptions received of $\hat{y}_1$ and for each m, $R_m \subset \{1, \ldots, K\}$ is the set of indices of the descriptions received of $\hat{y}_m$.

17. The system of claim 14, wherein $F_1$ is a wavelet transform and $F_2$ is a discrete cosine transform.

18. The system of claim 14, wherein the means for iteratively transforming calculation further comprises:
  means for transforming a set of data $y_1$ to a set of data $y_2$ using $F_2 \; F_1^{-1}$,
  means for setting components of the resulting set of data $y_2$ corresponding to received components to those received components $y_2'$,
  means for transforming the resulting set of data $y_2$ to a set of data $y_1$ using $F_1 \; F_2^{-1}$,
  means for setting components of the resulting set of data $y_1$ corresponding to received components to those received components $y_1'$, and
  means for transforming the resulting set of data $y_1$ to a set of data x' using $F_1^{-1}$,
wherein $F_1$ and $F_2$ are each K×K transforms.

19. The system of claim 16, further comprising
  means for providing an initial set of data x having K dimensions;
  means for overcompletely transforming the set of data x to a set of coefficients y having N dimensions, where N>K;
  means for quantizing the coefficients of y to obtain indices j such that each coefficient $y_i$ lies in the $j_i^{th}$ quantization region and each one of the indices j correspond to a respective quantization region;
  means for entropy coding the indices j to obtain binary descriptions; and
  means for transmitting the binary descriptions on a channel.

20. The system of claim 19 wherein the transmitting on the channel further comprises:
  means for storing the binary descriptions onto a storage medium; and
  means for reading the binary descriptions from the storage medium.

21. A computerized method of reconstructing data after a transmission on an erasure channel, the method comprising:
  providing an initial set of data x having K dimensions;
  overcompletely transforming the set of data x to a set of data y having N dimensions, where N>K;
  transmitting the set of data y on the channel;
  receiving a set of data y' from the channel; and
  iteratively transforming the received set of data y' using projections onto convex sets that use at least two different K×K transforms.

22. The method of claim 21, wherein the iteratively transforming further comprises:
(a) initializing a t=0;
(b) setting an initial point $p_1(0)$ such that for each index i,
  $p_{1,i}(0)=\hat{y}_{1,i}$ if $i \in R_1$ and
  $p_{1,i}(0)=0$ if $i \notin R_1$;
(c) transforming $p_1(t)$ into the coordinate system of $F_2$ using
$p_2(t)=F_2(F_1^{-1}p_1(t))=F_{12}p_1(t)$;

(d) projecting $p_2(t)$ onto $F_2Q$ such that for each index i,
$q_{2,i}(t+1)=\min\{\max\{p_{2,i}(t),l_{2,i}\},u_{2,i}\}$ if $i \in R_2$ and
$q_{2,i}(t+1)=p_{2,i}(t)$ if $i \notin R_2$;
(e) transforming $q_2(t+1)$ into the coordinate system of $F_1$ using
$q_1(t+1)=F_1(F_2^{-1}q_2(t+1))=F_{21}q_2(t+1)$;
(f) projecting $q_1(t+1)$ onto $F_1P$ such that for each index i,
$p_{1,i}(t+1)=\min\{\max\{q_{1,i}(t+1),l_{1,i}\},u_{1,i}\}$ if $i \in R_1$ and
$p_{1,i}(t+1)=p_{2,i}(t)$ if $i \notin R_1$;
(g) checking for convergence by testing $\|p_1(t+1)-p_1(t)\|^2 > \epsilon$, and if so then setting
$t \leftarrow t+1$ and iterating (c) through (g); and
(h) reconstructing a set of data $\hat{x}=F_1^{-1}p_1(t)$;
wherein:
$F_1$ and $F_2$ are each K×K transforms,
$F_1^{-1}$ is the inverse transform of $F_1$, $F_2^{-1}$ is the inverse transform of $F_2$,
$\hat{y}_1$ is a quantized version of $y_1$, $\hat{y}_2$ is a quantized version of $y_2$, such that $\hat{y}_1$ componentwise lies between respective lower and upper quantization cell boundary vectors $l_1 \leq \hat{y}_1 \leq u_1$ and $\hat{y}_2$ componentwise lies between respective lower and upper quantization cell boundary vectors $l_2 \leq \hat{y}_2 \leq u_2$,
$R_1 \subset \{1, \ldots, K\}$ is the set of indices of the descriptions received of $\hat{y}_1$, and
$R_2 \subset \{1, \ldots, K\}$ is the set of indices of the descriptions received of $\hat{y}_2$.

23. The method of claim 21, wherein the iteratively transforming further comprises:
(a) initializing a t=0;
(b) setting $p_{1,i}(0)=\hat{y}_{1,i}$ if $i \in R_1$ (i.e., received descriptions) and
$p_{1,i}(0)=0$ if $i \notin R_1$; (i.e., descriptions not received)
(c) for each m=1, ..., M–1 in turn:
  (i) transforming $p_m(t)$ into the coordinate system of $F_{m+1}$:
  $\tilde{p}_{m+1}(t)=F_{m+1}F_m^{-1}P_m(t)=F_{m,m+1}p_m(t)$; and
  (ii) projecting $\tilde{p}_{m+1}(t)$ onto $F_{m+1}P_{m+1}$:
  $p_{m+1,i}(t)=\min\{\max\{\tilde{p}_{m+1,i}(t), l_{m+1,i}\}u_{m+1,i}\}$ if $i \in R_2$
  $p_{m+1,i}(t)=\tilde{p}_{m+1,i}(t)$ if $i \notin R_2$
(d) transforming $p_M(t)$ into the coordinate system of $F_1$:
$\tilde{p}_1(t+1)=F_1F_M^{-1}p_M(t)=F_{M,1}p_M(t)$
(e) projecting $\tilde{p}_1(t+1)$ onto $F_1P_1$:
$p_{1,i}(t+1)=\min\{\max\{\tilde{p}_{1,i}(t+1), l_{1,i}\}, u_{1,i}\}$ if $i \in R_1$
$p_{1,i}(t+1)=\tilde{p}_{1,i}(t+1)$ if $i \notin R_1$
(k) checking for convergence, and if $\|p_n(t+1)-p_n(t)\|^2 >$ epsilon for an n between 1 and M inclusive,
then setting $t \leftarrow t+1$ and repeating (c) through (f), otherwise performing (g); and
(g) reconstructing x:
$\hat{x}=F_n^{-1}p_n(t+1)$;
wherein:
$F_1$ through $F_M$ are each K×K transforms,
M is an integer larger than 1,
each $F_m^{-1}$ is the inverse transform of $F_m$,
$\hat{y}_1$ is a quantized version of $y_1$, such that $\hat{y}_1$ componentwise lies between respective lower and upper quantization cell boundary vectors $l_1 \leq \hat{y}_1 \leq u_1$ and each $\hat{y}_m$ componentwise lies between respective lower and upper quantization cell boundary vectors $l_m \leq \hat{y}_m \leq u_m$,
$R_1 \subset \{1, \ldots, K\}$ is the set of indices of the descriptions received of $\hat{y}_1$, and for each m, $R_m \subset \{1, \ldots, K\}$ is the set of indices of the descriptions received of $\hat{y}_m$.

24. A computer-readable medium having instructions stored thereon for causing a computer to perform the method of claim 22.

25. A computer-readable medium having instructions stored thereon for causing a computer to perform the method of claim 23.

26. A data-reconstruction mechanism for an image system, the mechanism comprising:
a module that receives a set of data y', wherein the set of data y' corresponds to a set of data y but with some coefficients missing, wherein the set of data y has N dimensions and represents an overcomplete transformation of the set of image data x, and wherein N>K; and
a module that iteratively transforms the received set of data y' using projections onto convex sets as calculated with a computer to produce a set of image data x' representing the reconstructed set of image data x.

27. The mechanism of claim 26, wherein the module that iteratively transforms includes:
a module that transforms a set of data $y_1$ to a set of data $y_2$ using $F_2F_1^{-1}$,
a module that sets components of the resulting set of data $y_2$ corresponding to received components to those received components $y_2'$,
a module that transforms the resulting set of data $y_2$ to a set of data $y_1$ using $F_1F_2^{-1}$,
a module that sets components of the resulting set of data $y_1$ corresponding to received components to those received components $y_1'$, and
a module that transforms the resulting set of data $y_1$ to a set of data x' using $F_1^{-1}$,
wherein $F_1$ and $F_2$ are structured transforms that project onto convex sets.

28. The mechanism of claim 26, wherein the module that iteratively transforms includes:
(a) a module that initializes a t=0;
(b) a module that sets an initial point $p_1(0)$ such that for each index i,
$p_{1,i}(0)=\hat{y}_{1,i}$ if $i \in R_1$ and
$p_{1,i}(0)=0$ if $i \notin R_1$;
(c) a module that transforms $p_1(t)$ into the coordinate system of $F_2$ using
$p_2(t)=F_2(F_1^{-1}p_1(t))=F_{12}p_1(t)$;
(d) a module that projects $p_2(t)$ onto $F_2Q$ such that for each index i,
$q_{2,i}(t+1)=\min\{\max\{p_{2,i}(t),l_{2,i}\},u_{2,i}\}$ if $i \in R_2$ and
$q_{2,i}(t+1)=p_{2,i}(t)$ if $i \notin R_2$;
(e) a module that transforms $q_2(t+1)$ into the coordinate system of $F_1$ using
$q_1(t+1)=F_1(F_2^{-1}q_2(t+1))=F_{21}q_2(t+1)$;
(f) a module that projects $q_1(t+1)$ onto $F_1P$ such that for each index i,
$p_{1,i}(t+1)=\min\{\max\{q_{1,i}(t+1),l_{1,i}\},u_{1,i}\}$ if $i \in R_1$ and
$p_{1,i}(t+1)=p_{2,i}(t)$ if $i \notin R_1$;
(g) a module that checks for convergence by testing if $\|p_1(t+1)-p_1(t)\|^2 > \epsilon$, and if
so then sets $t \leftarrow t+1$ and iterates modules (c) through (g); and
(h) a module that reconstructs a set of data $\hat{x}=F_1^{-1}p_1(t)$;
wherein:
$F_1$ and $F_2$ are each K×K transforms,
$F_1^{-1}$ is the inverse transform of $F_1$, $F_2^{-1}$ is the inverse transform of $F_2$, $\hat{y}_1$ is a quantized version of $y_1$, $\hat{y}_2$ is a quantized version of $y_2$, such that $\hat{y}_1$ componentwise lies between respective lower and upper quantization cell boundary vectors $l_1 \leq \hat{y}_1 \leq u_1$ and $\hat{y}_2$ componentwise lies between respective lower and upper quantization cell boundary vectors $l_2 \leq \hat{y}_2 \leq u_2$, $R_1 \subset \{1, \ldots, K\}$ is the set of indices of the descriptions received of $\hat{y}_1$, and $R_2 \subset \{1, \ldots, K\}$ is the set of indices of the descriptions received of $\hat{y}_2$.

29. The mechanism of claim 26, wherein the module that iteratively transforms includes:

(a) a module that initializes a $t=0$;

(b) a module that sets an initial point $p_1(0)$ such that for each index i, $p_{1,i}(0)=\hat{y}_{1,i}$ if $i \in R_1$ (i.e., received descriptions) and $p_{1,i}(0)=0$ if $i \notin R_1$; (i.e., descriptions not received)

(c) for each m=1, ..., M−1 in turn:

(i) a module that transforms $p_m(t)$ into the coordinate system of $F_{m+1}$:

$\tilde{p}_{m+1}(t)=F_{m+1}F_{m+1}p_m(t)=F_{m,m+1}p_m(t)$; and (ii) a module that projects $\tilde{p}_{m+1}(t)$ onto $F_{m+1}P_{m+1}$:

$p_{m+1,i}(t)=\min\{\max\{\tilde{p}_{m+1,i}(t), l_{m+1,i}\}u_{m+1,i}\}$ if $i \in R_2$ $p_{m+1,i}(t)=\tilde{p}_{m+1,i}(t)$ if $i \notin R_2$ (d) a module that transforms $p_M(t)$ into the coordinate system of $F_1$:

$\tilde{p}_1(t+1)=F_1F_M^{-1}p_M(t)=F_{M,1}p_M(t)$ (e) a module that projects $\tilde{p}_1(t+1)$ onto $F_1P_1$:

$p_{1,i}(t+1)=\min\{\max\{\tilde{p}_{1,i}(t+1), l_{1,i}\}, u_{1,i}\}$ if $i \in R_1$ $p_{1,i}(t+1)=\tilde{p}_{1,i}(t+1)$ if $i \notin R_1$ (l) a module that checks for convergence, and if $\|p_n(t+1)-p_n(t)\|^2 >$ epsilon for an n between 1 and M inclusive, then sets $t \leftarrow t+1$ and repeating (c) through (f), otherwise performs (g); and (g) a module that reconstructs x:

$\hat{x}=F_n^{-1}p_n(t+1)$;

wherein:

$F_1$ through $F_M$ are each K×K transforms,

M is an integer larger than 1, each $F_m^{-1}$ is the inverse transform of $F_m$, $\hat{y}_1$ is a quantized version of $y_1$, such that $\hat{y}_1$ componentwise lies between respective lower and upper quantization cell boundary vectors $l_1 \leq \hat{y}_1 \leq u_1$ and each $\hat{y}_m$ componentwise lies between respective lower and upper quantization cell boundary vectors $l_m \leq \hat{y}_m \leq u_m$, $R_1 \subset \{1, \ldots, K\}$ is the set of indices of the descriptions received of $\hat{y}_1$, and for each m, $R_m \subset \{1, \ldots, K\}$ is the set of indices of the descriptions received of $\hat{y}_m$.

30. A computerized method of reconstructing data after a transmission on an erasure channel, the method comprising:

iteratively transforming the received set of data y' using projections onto convex sets that use at least two different K×K transforms including:

(a) initializing t;

(b) setting an initial point in $F_1P$;

(c) transforming $p_1(t)$ into the coordinate system of $F_2$;

(d) projecting $p_2(t)$ onto $F_2Q$;

(e) transforming $q_2(t+1)$ into the coordinate system of $F_1$;

(f) projecting $q_1(t+1)$ onto $F_1P$;

(g) checking for convergence and if not sufficiently converged then iterating (c) through (g); and (h) reconstructing $\hat{x}=F_1^{-1}p_1(t+1)$ wherein:

$F_1$ and $F_2$ are each K×K transforms.

31. The method of claim 30, further comprising:

providing an initial set of data x having K dimensions;

overcompletely transforming the set of data x to a set of data y having N dimensions, where N>K; transmitting the set of data y on the channel; and receiving a set of data y' from the channel.

32. The method of claim 30, wherein (a) initializing further includes initializing $t=0$;

(b) starting further includes setting an initial point $p_1(0)$ such that for each index i, $p_{1,i}(0)=\hat{y}_{1,i}$ if $i \in R_1$ and $p_{1,i}(0)=0$ if $i \notin R_1$;

(c) transforming $p_1(t)$ further includes transforming $p_1(t)$ into the coordinate system of $F_2$ using $p_2(t)=F_2(F_1^{-1}p_1(t))=F_{12}p_1(t)$;

(d) projecting $p_2(t)$ further includes projecting $p_2(t)$ onto $F_2Q$ such that for each index i:

$q_{2,i}(t+1)=\min\{\max\{p_{2,i}(t),l_{2,i}\},u_{2,i}\}$ if $i \in R_2$ and $q_{2,i}(t+1)=p_{2,i}(t)$ if $i \notin R_2$;

(e) transforming $q_2(t+1)$ further includes transforming $q_2(t+1)$ into the coordinate system of $F_1$ using $q_1(t+1)=F_1(F_2^{-1}q_2(t+1))=F_{21}q_2(t+1)$;

(f) projecting $q_1(t+1)$ further includes projecting $q_1(t+1)$ onto $F_1P$ such that for each index i:

$p_{1,i}(t+1)=\min\{\max\{q_{1,i}(t+1),l_{1,i}\},u_{1,i}\}$ if $i \in R_1$ and $p_{1,i}(t+1)=p_{2,i}(t)$ if $i \notin R_1$; and (g) checking further includes checking for convergence by testing $\|p_1(t+1)-p_1(t)\|^2 > \epsilon$, and if so then setting $t \leftarrow t+1$ and iterating (c) through (g).

and wherein:

$F_1$ and $F_2$ are each K×K transforms, $F_1^{-1}$ is the inverse transform of $F_1$, $F_2^{-1}$ is the inverse transform of $F_2$, $\hat{y}_1$ is a quantized version of $y_1$, $\hat{y}_2$ is a quantized version of $y_2$, such that $\hat{y}_1$ componentwise lies between respective lower and upper quantization cell boundary vectors $l_1 \leq \hat{y}_1 \leq u_1$ and $\hat{y}_2$ componentwise lies between respective lower and upper quantization cell boundary vectors $l_2 \leq \hat{y}_2 \leq u_2$, $R_1 \subset \{1, \ldots, K\}$ is the set of indices of the descriptions received of $\hat{y}_1$, and $R_2 \subset \{1, \ldots, K\}$ is the set of indices of the descriptions received of $\hat{y}_2$.

33. The method of claim 30, wherein the (a) initializing t, (b) setting an initial point in $F_1P$, (c) transforming $p_1(t)$ into the coordinate system of $F_2$, (d) projecting $p_2(t)$ onto $F_2Q$, (e) transforming $q_2(t+1)$ into the coordinate system of $F_1$, (f) projecting $q_1(t+1)$ onto $F_1P$, (g) checking for convergence and if not sufficiently converged then iterating (c) through (g); and (h) reconstructing $\hat{x}=F_1^{-1}p_1(t+1)$ are performed in the order listed.

* * * * *

UNITED STATES PATENT AND TRADEMARK OFFICE
CERTIFICATE OF CORRECTION

PATENT NO. : 6,470,469 B1
DATED : October 22, 2002
INVENTOR(S) : Phillip Chou et al.

It is certified that error appears in the above-identified patent and that said Letters Patent is hereby corrected as shown below:

Column 13,
Line 67, "$Q \subset R^n$" should be changed to -- $Q \subseteq R^n$ --
Line 67, "$P \subset R^n$" should be changed to -- $P \subseteq R^n$ --

Column 14,
Line 26, "$Q = F'R^K \subset R^{N'}$" should be changed to -- $Q = F'R^K \subseteq R^{N'}$ --

Line 26, "$P = Q^{-1}(\hat{y}') \subset R^{N'}$" should be changed to -- $P = Q^{-1}(\hat{y}') \subseteq R^{N'}$ --

Column 15,
Line 58, "$R_1 \subset \{1, \ldots, K\}$" should be changed to -- $R_1 \subseteq \{1, \ldots, K\}$ --
Line 59, "$R_2 \subset \{1, \ldots, K\}$" should be changed to -- $R_2 \subseteq \{1, \ldots, K\}$ --

Column 19,
Line 35, "if $i \in R_2$" should be changed to -- if $i \notin R_2$ --
Line 45, "if $i \in R_1$" should be changed to -- if $i \notin R_1$ --

Column 21,
Line 23, equation should appear as follows:

$$N' = |R_1| + \ldots + |R_M|$$

Column 24,
Line 52, "$\in_K (N)$" should be changed to -- $\varepsilon_K(N)$ --
Line 54, equation should appear as follows:

$$2^{2b}\varepsilon'_K(N) = \text{constant}$$

Line 55, "$\in'_K (N)$" should be changed to -- $\varepsilon'_K(N)$ --
Line 55, "$\in_K (N)$" should be changed to -- $\varepsilon_K(N)$ --

Column 26,
Line 67, "$R_1 \subset \{1, \ldots, K\}$" should be changed to -- $R_1 \subseteq \{1, \ldots, K\}$ --

UNITED STATES PATENT AND TRADEMARK OFFICE
CERTIFICATE OF CORRECTION

PATENT NO. : 6,470,469 B1
DATED : October 22, 2002
INVENTOR(S) : Phillip Chou et al.

It is certified that error appears in the above-identified patent and that said Letters Patent is hereby corrected as shown below:

Column 27,
Line 1, "$R_2 \subset \{1, \ldots, K\}$" should be changed to -- $R_2 \subseteq \{1, \ldots, K\}$ --
Line 4, equation should appear as follows:

$$\|p_1(t+1) - p_1(t)\|^2 > \varepsilon$$

Line 39, "$R_1 \subset \{1, \ldots, K\}$" should be changed to -- $R_1 \subseteq \{1, \ldots, K\}$ --
Line 41, "$R_m \subset \{1, \ldots, K\}$" should be changed to -- $R_m \subseteq \{1, \ldots, K\}$ --

Column 28,
Line 24, "$F_1^{31\ 1}$" should be changed to -- $F_1^{-1}$ --
Line 31, "$R_1 \subset \{1, \ldots, K\}$" should be changed to -- $R_1 \subseteq \{1, \ldots, K\}$ --
Line 32, "$R_2 \subset \{1, \ldots, K\}$" should be changed to -- $R_2 \subseteq \{1, \ldots, K\}$ --
Line 36, equation should appear as follows:

$$\|p_1(t+1) - p_1(t)\|^2 > \varepsilon$$

Column 29,
Line 5, "$R_1 \subset \{1, \ldots, K\}$" should be changed to -- $R_1 \subseteq \{1, \ldots, K\}$ --
Line 7, "$R_m \subset \{1, \ldots, K\}$" should be changed to -- $R_m \subseteq \{1, \ldots, K\}$ --

Column 30,
Line 45, "$R_1 \subset \{1, \ldots, K\}$" should be changed to -- $R_1 \subseteq \{1, \ldots, K\}$ --
Line 47, "$R_2 \subset \{1, \ldots, K\}$" should be changed to -- $R_2 \subseteq \{1, \ldots, K\}$ --
Line 51, equation should appear as follows:

$$\|p_1(t+1) - p_1(t)\|^2 > \varepsilon$$

Column 32,
Line 21, equation should appear as follows:

$$\tilde{p}_{m+1}(t) = F_{m+1} F_m^{-1} P_m(t) = F_{m,m+1} p_m(t);$$

Line 45, "$R_1 \subset \{1, \ldots, K\}$" should be changed to -- $R_1 \subseteq \{1, \ldots, K\}$ --
Line 46, "$R_m \subset \{1, \ldots, K\}$" should be changed to -- $R_m \subseteq \{1, \ldots, K\}$ --

UNITED STATES PATENT AND TRADEMARK OFFICE
CERTIFICATE OF CORRECTION

PATENT NO. : 6,470,469 B1  
DATED : October 22, 2002  
INVENTOR(S) : Phillip Chou et al.

Page 3 of 4

It is certified that error appears in the above-identified patent and that said Letters Patent is hereby corrected as shown below:

Column 33,  
Line 34, equation should appear as follows:

$$\|p_1(t+1) - p_1(t)\|^2 > \varepsilon$$

Column 34,  
Line 6, "$R_1 \subset \{1, \ldots, K\}$" should be changed to -- $R_1 \subseteq \{1, \ldots, K\}$ --  
Line 7, "$R_m \subset \{1, \ldots, K\}$" should be changed to -- $R_m \subseteq \{1, \ldots, K\}$ --

Column 35,  
Line 3, equation should appear as follows:

$$Q_{2,i}(t+1) = p_{2,i}(t)$$

Line 11, equation should appear as follows:

$$\|p_1(t+1) - p_1(t)\|^2 > \varepsilon$$

Column 36,  
Line 60, equation should appear as follows:

$$\|p_1(t+1) - p_1(t)\|^2 > \varepsilon$$

Column 37,  
Line 7, "$R_1 \subset \{1, \ldots, K\}$" should be changed to -- $R_1 \subseteq \{1, \ldots, K\}$ --  
Line 9, "$R_2 \subset \{1, \ldots, K\}$" should be changed to -- $R_2 \subseteq \{1, \ldots, K\}$ --  
Line 50, "$R_1 \subset \{1, \ldots, K\}$" should be changed to -- $R_1 \subseteq \{1, \ldots, K\}$ --  
Line 51, "$R_m \subset \{1, \ldots, K\}$" should be changed to -- $R_m \subseteq \{1, \ldots, K\}$ --

Column 38,  
Line 36, equation should appear as follows:

$$\|p_1(t+1) - p_1(t)\|^2 > \varepsilon$$

UNITED STATES PATENT AND TRADEMARK OFFICE
CERTIFICATE OF CORRECTION

PATENT NO. : 6,470,469 B1
DATED : October 22, 2002
INVENTOR(S) : Phillip Chou et al.

It is certified that error appears in the above-identified patent and that said Letters Patent is hereby corrected as shown below:

Column 38, cont'd,
Line 50, "$R_1 \subset \{1, \ldots, K\}$" should be changed to -- $R_1 \subseteq \{1, \ldots, K\}$ --
Line 52, "$R_2 \subset \{1, \ldots, K\}$" should be changed to -- $R_2 \subseteq \{1, \ldots, K\}$ --

Signed and Sealed this

Twenty-second Day of July, 2003

JAMES E. ROGAN
*Director of the United States Patent and Trademark Office*